US012648424B2

(12) United States Patent
Tzeng et al.

(10) Patent No.: US 12,648,424 B2
(45) Date of Patent: Jun. 2, 2026

(54) INTEGRATED CIRCUIT WITH INTERNAL CONNECTION STRUCTURE

(71) Applicant: TAIWAN SEMICONDUCTOR MANUFACTURING COMPANY, LTD., Hsinchu (TW)

(72) Inventors: Wei-Cheng Tzeng, Taipei City (TW); Shih-Wei Peng, Hsinchu City (TW); Chun-Yen Lin, Hsinchu City (TW); Wei-Cheng Lin, Taichung City (TW); Jiann-Tyng Tzeng, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 503 days.

(21) Appl. No.: 18/357,483

(22) Filed: Jul. 24, 2023

(65) Prior Publication Data

US 2025/0038071 A1     Jan. 30, 2025

(51) Int. Cl.
| | |
|---|---|
| *H10W 20/20* | (2026.01) |
| *H10D 84/01* | (2025.01) |
| *H10D 84/03* | (2025.01) |
| *H10D 84/85* | (2025.01) |

(52) U.S. Cl.
CPC ........ *H10W 20/20* (2026.01); *H10D 84/0186* (2025.01); *H10D 84/0188* (2025.01); *H10D 84/038* (2025.01); *H10D 84/85* (2025.01)

(58) Field of Classification Search
CPC . H10W 20/20; H10D 84/0188; H10D 84/038; H10D 30/014; H10D 30/43; H10D 30/501; H10D 62/121; H10D 64/518; H10D 88/00; H10D 88/01; B82Y 10/00
See application file for complete search history.

(56) References Cited

U.S. PATENT DOCUMENTS

| | | | |
|---|---|---|---|
| 2022/0122971 A1* | 4/2022 | Peng | ................. H01L 21/02603 |
| 2022/0344255 A1* | 10/2022 | Lai | ....................... H10D 64/018 |
| 2023/0411358 A1* | 12/2023 | Xie | ....................... H10D 64/017 |
| 2024/0021586 A1* | 1/2024 | Li | ........................... H10D 88/01 |

* cited by examiner

*Primary Examiner* — Fernando L Toledo
*Assistant Examiner* — Adam S Bowen
(74) *Attorney, Agent, or Firm* — Birch, Stewart, Kolasch & Birch, LLP

(57) ABSTRACT

An integrated circuit is provided, including a first transistor of a first conductivity type comprising first and second active regions, a second transistor of a second conductivity type comprising third and fourth active regions and arranged under the first transistor along a first direction, a first gate structure extending in the first direction and shared by the first and second transistors, an isolation layer sandwiched between the first and second transistors and extending along a second direction to pass through the first gate structure, and a connection layer surrounded by the isolation layer and extending along the second direction to pass through the first gate structure. The isolation layer has a first surface contacting the first and second active regions and a second surface contacting the third and fourth active regions. The connection layer comprises first and second portions are electrically coupled to the first and fourth active regions.

20 Claims, 27 Drawing Sheets

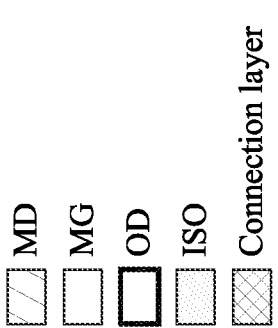
MD
MG
OD
ISO
Connection layer
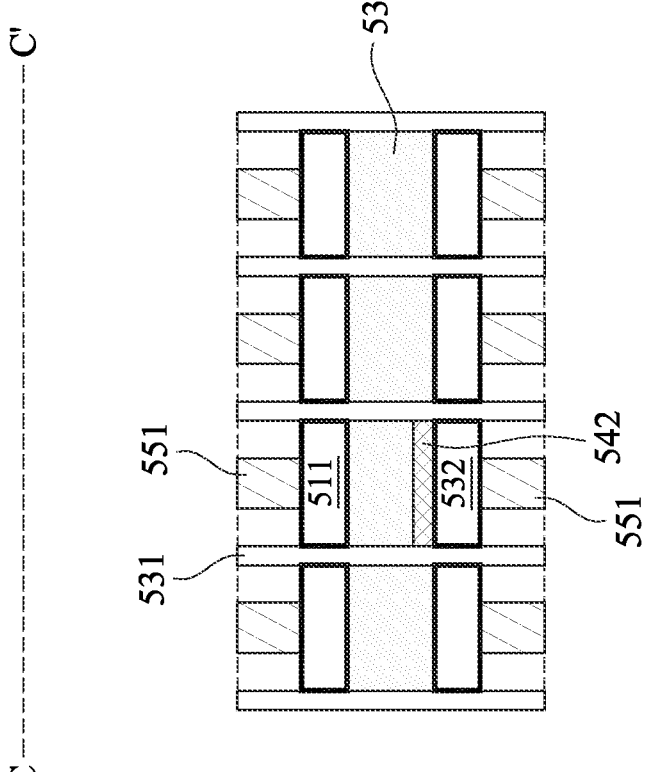
53
551
531
511
532
542
551
50
C
C'
X
Z
FIG. 5C

60

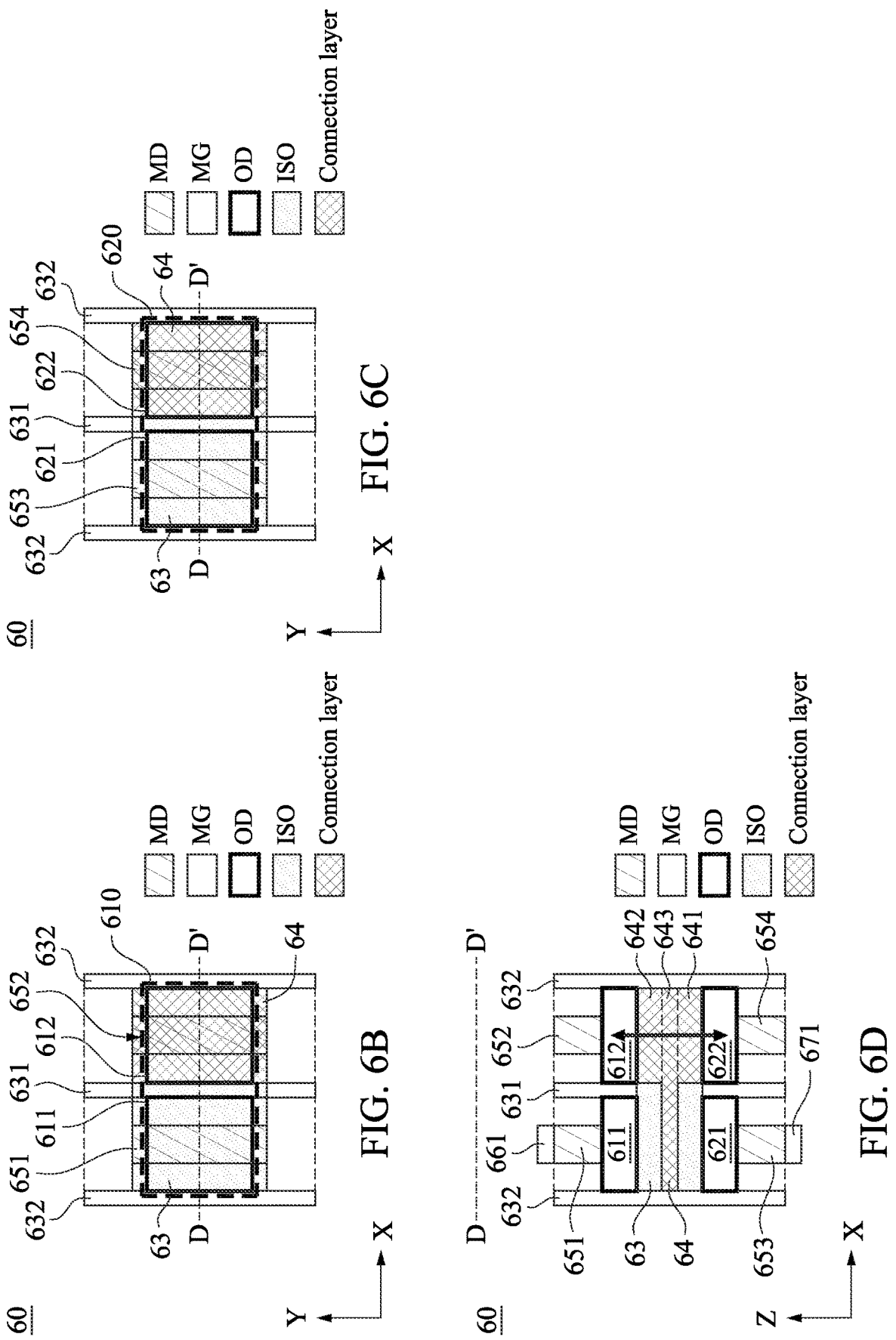

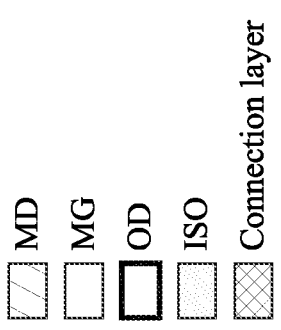
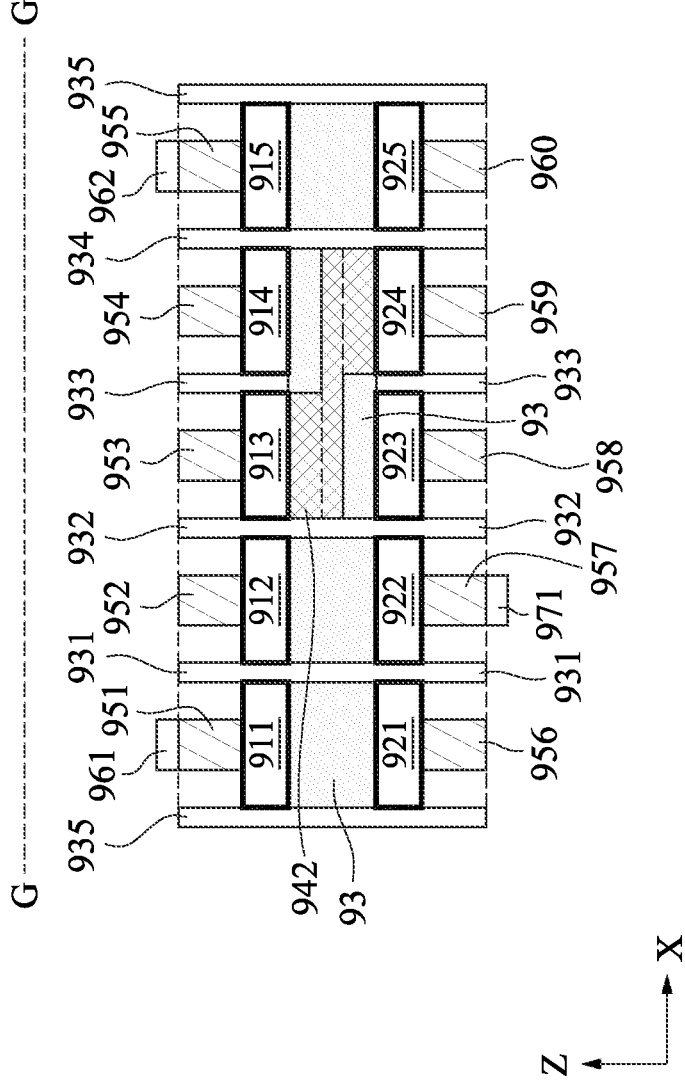
FIG. 9D

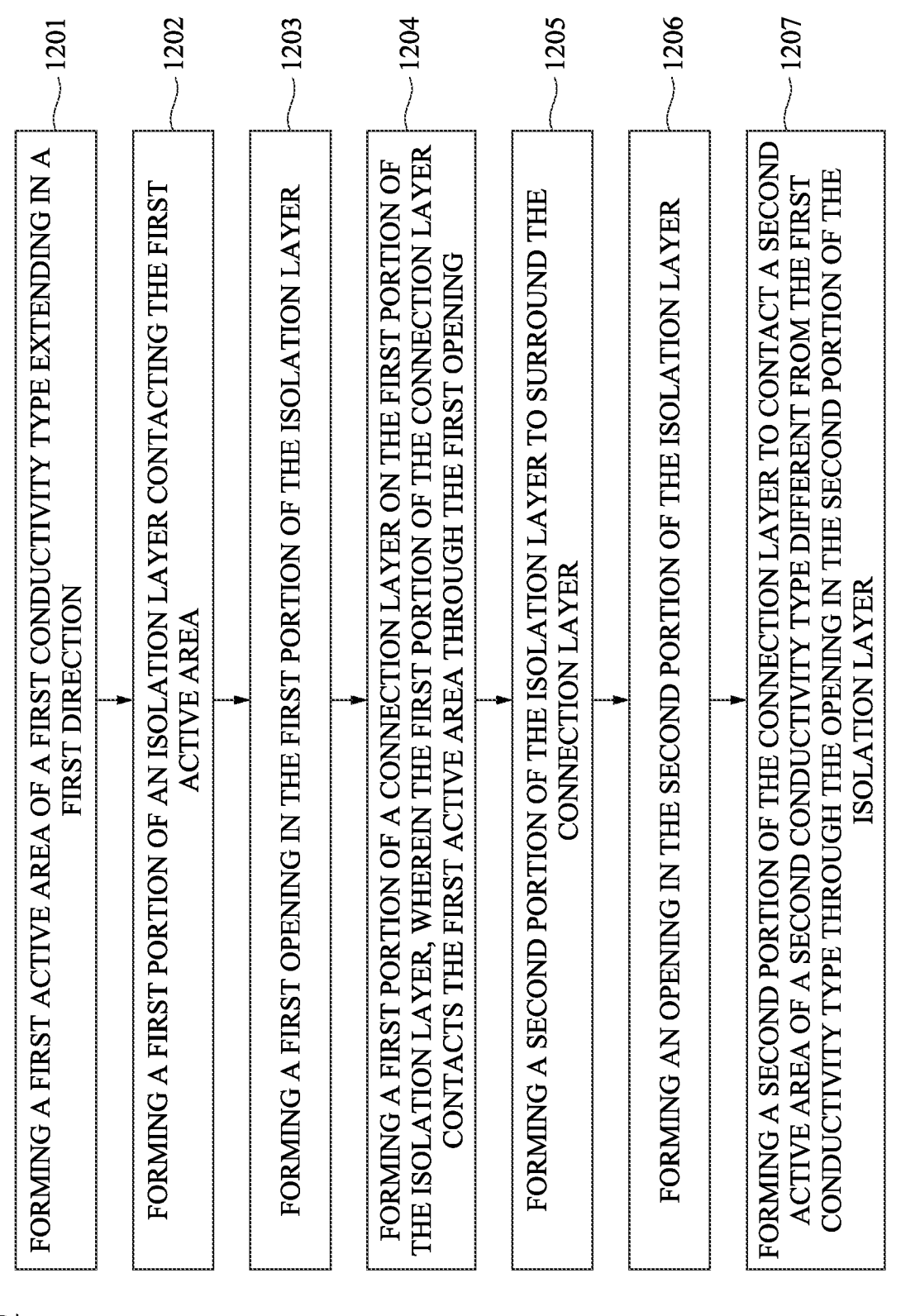

1200

1201 — FORMING A FIRST ACTIVE AREA OF A FIRST CONDUCTIVITY TYPE EXTENDING IN A FIRST DIRECTION

1202 — FORMING A FIRST PORTION OF AN ISOLATION LAYER CONTACTING THE FIRST ACTIVE AREA

1203 — FORMING A FIRST OPENING IN THE FIRST PORTION OF THE ISOLATION LAYER

1204 — FORMING A FIRST PORTION OF A CONNECTION LAYER ON THE FIRST PORTION OF THE ISOLATION LAYER, WHEREIN THE FIRST PORTION OF THE CONNECTION LAYER CONTACTS THE FIRST ACTIVE AREA THROUGH THE FIRST OPENING

1205 — FORMING A SECOND PORTION OF THE ISOLATION LAYER TO SURROUND THE CONNECTION LAYER

1206 — FORMING AN OPENING IN THE SECOND PORTION OF THE ISOLATION LAYER

1207 — FORMING A SECOND PORTION OF THE CONNECTION LAYER TO CONTACT A SECOND ACTIVE AREA OF A SECOND CONDUCTIVITY TYPE DIFFERENT FROM THE FIRST CONDUCTIVITY TYPE THROUGH THE OPENING IN THE SECOND PORTION OF THE ISOLATION LAYER

MEMORY
1360

INSTRUCTIONS
1361

STANDARD CELL
LIBRARY
INCLUDING:
STANDARD CELLS
1362

USER INTERFACE
(UI)
1363

FABRICATION
TOOL
1370

I/O
1310

PROCESSOR
1320

NETWORK
INTERFACE
1330

NETWORK
1340

INTEGRATED CIRCUIT WITH INTERNAL CONNECTION STRUCTURE

BACKGROUND

Along with the progressive process of manufacturing semiconductor devices, to achieve better density of transistor arrangement, the complementary field-effect transistor is proposed to reduce cell height by buried power rail and PMOS/NMOS of different depth. Accordingly, optimization to effectiveness of metal routing in integrated circuit becomes a significant issue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5C is a schematic diagram of an integrated circuit corresponding to FIGS. 5A-5B in a cross-section view, in accordance with some embodiments.

FIG. 6B is schematic layout diagram of part of a top layer in an integrated circuit corresponding to FIG. 6A, in accordance with some embodiments.

FIG. 6C is schematic layout diagram of part of a bottom layer in an integrated circuit corresponding to FIG. 6A, in accordance with some embodiments.

FIG. 6D is a schematic diagram of an integrated circuit corresponding to FIGS. 6A-6C in a cross-section view, in accordance with some embodiments.

FIG. 9D is a schematic diagram of an integrated circuit corresponding to FIGS. 9A-9C in a cross-section view, in accordance with some embodiments.

FIG. 12 is a flow chart of a method of manufacturing an integrated circuit, in accordance with some embodiments.

DETAILED DESCRIPTION

Figure 1A:
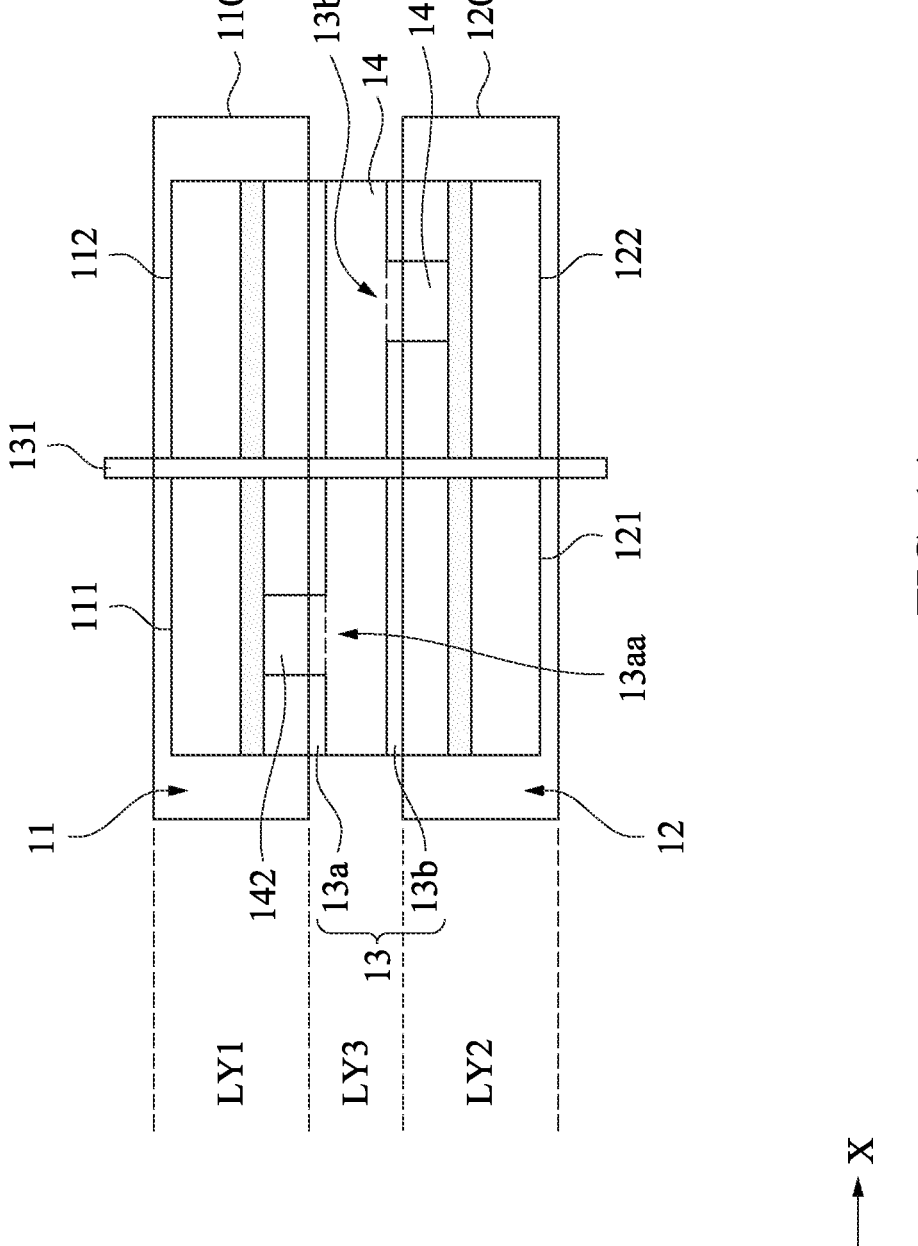
FIG. 1A is a schematic diagram of an integrated circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Figure 1C:
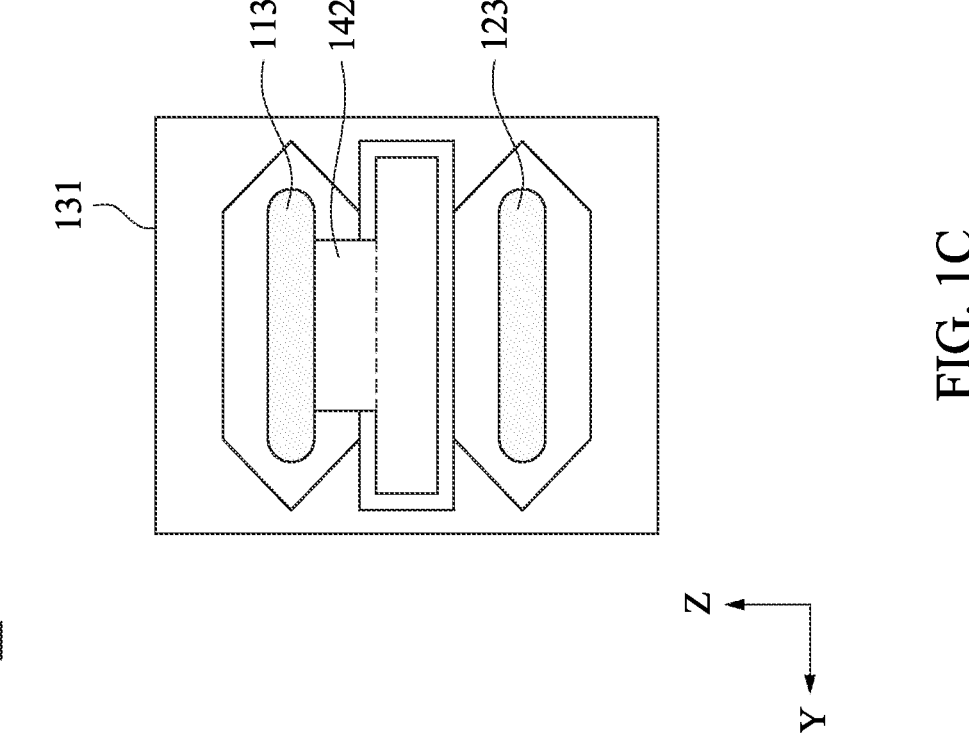
FIGS. 1B-1C are schematic diagrams of part of the integrated circuit in FIG. 1A, in accordance with some embodiments.
Figure 1B:
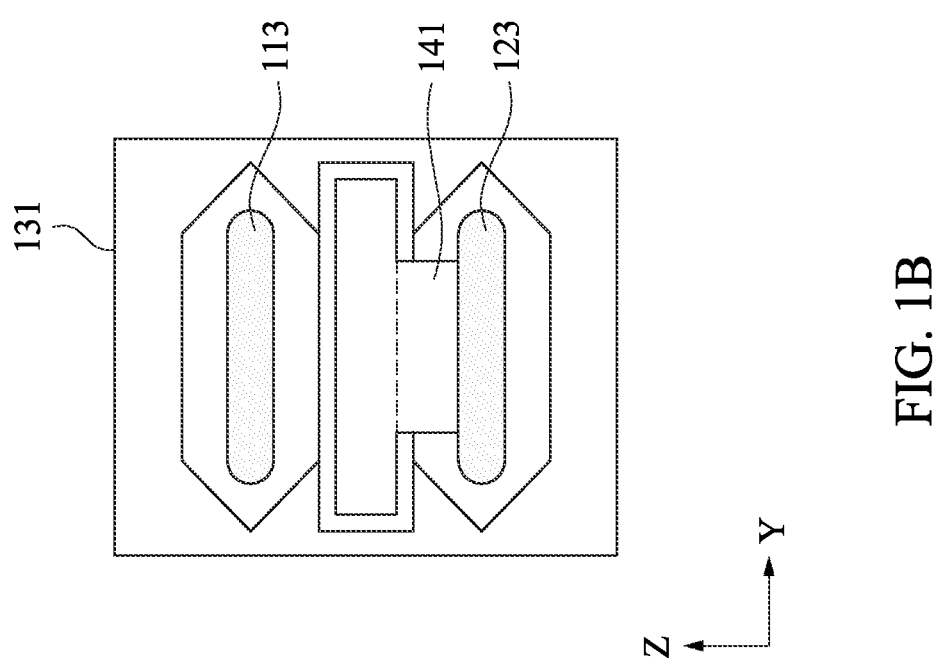
Figure 1D:
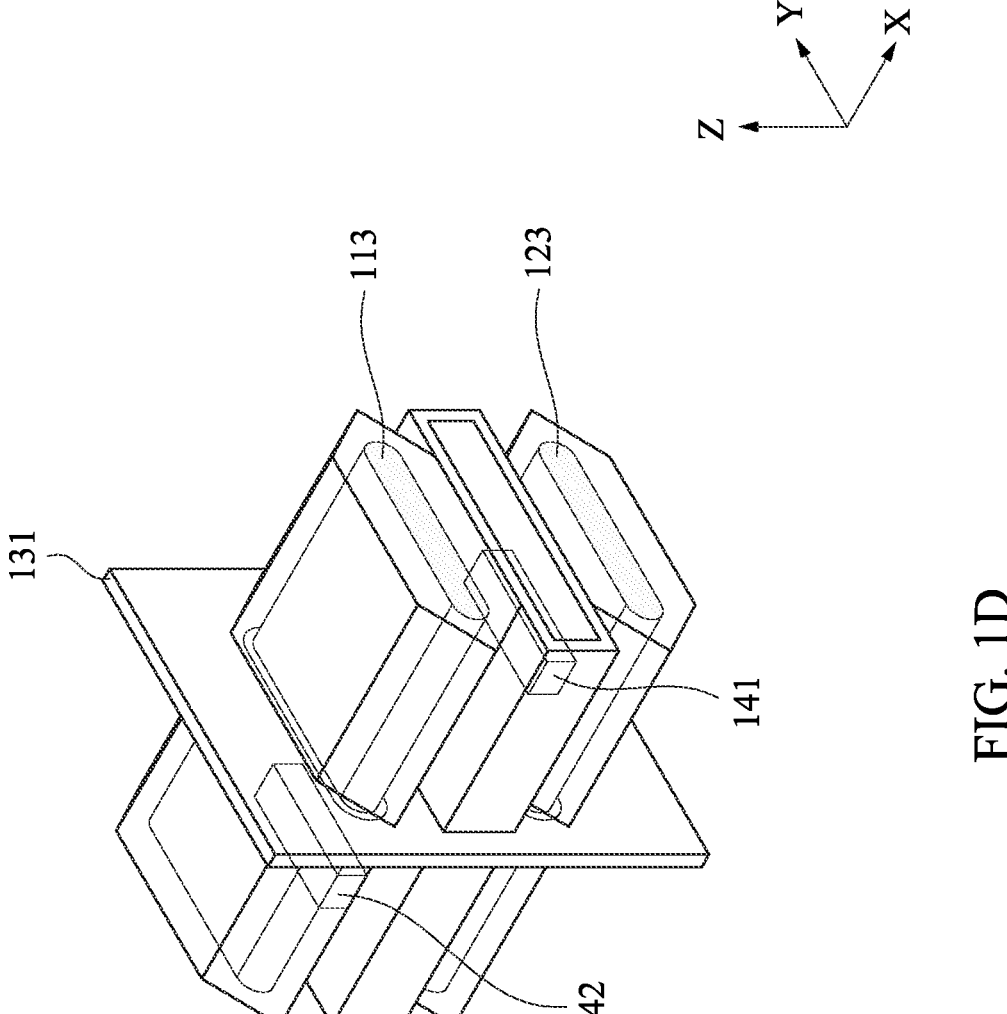
FIG. 1D is schematic diagram of the integrated circuit in FIG. 1A, in accordance with some embodiments.

Reference is now made to FIG. 1A. FIG. 1A is a schematic diagram of an integrated circuit 10, in accordance with some embodiments. FIGS. 1B-1C are schematic diagrams of part of the integrated circuit 10 in FIG. 1A in a side view, in accordance with some embodiments. FIG. 1D is schematic diagram of the integrated circuit 10 in FIG. 1A, in accordance with some embodiments.

For illustration, the integrated circuit 10 includes transistors 11-12, an isolation layer 13, and a connection layer 14. The transistors 11-12 are separated from each other by the isolation layer 13 along z direction.

Specifically, the transistor 12 is arranged under the transistor 11 in z direction. The transistor 11 includes active regions (e.g., also referred as to oxide diffusions, OD) 111-112 arranged in an active area 110 disposed in a first semiconductor layer LY1. The transistor 12 includes active regions (e.g., also referred as to oxide diffusions, OD) 121-122 arranged in an active area 120 disposed in a second semiconductor layer LY2. In some embodiments, the first semiconductor layer LY1 is over the second semiconductor layer LY1 along z direction, and the first and second semiconductor layers L1-L2 are referred to as top and bottom layers of the integrated circuit 10. A gate structure (e.g., also referred as to metal gate structure, MG) 131 extends in z direction and is shared by the transistors 11-12.

As illustratively shown in FIG. 1A, the isolation layer 13 is arranged in a third semiconductor layer LY3 sandwiched the first and second semiconductor layers LY1-LY2. Alternatively stated, the isolation layer 13 is arranged between the transistors 11 and 12 and further extends along x direction to pass through the gate structure 131. The isolation layer 13 includes portions 13a and 13b, in which a surface of the portion 13a contacts the active regions 121-122 and a surface of the portion 13b contacts the active regions 111-112. In some embodiments, the isolation layer 13 is configured to isolate the active region 111 form the active region 121, and to isolate the active region 112 from the active region 122.

The connection layer 14 is arranged in the third semiconductor layer and surrounded by the isolation layer 13. The connection layer 14 extends in x direction to pass through the gate structure 131, as shown in FIG. 1A. In some embodiments, the isolation layer 13 is configured to isolate the connection layer 14 from the gate structure 131.

The connection layer 14 includes three portions 141-143 in which the portion 143 connects the portions 141-142 to each other. As shown in FIG. 1A, the portions 141 and 142 are disposed on the opposite sides of the gate structure 131. The portion 143 extends in x direction to pass through the gate structure 131.

In some embodiments, as shown in FIG. 1B, the portion 141 extends in z direction to pass through an opening in the portion 13b of the isolation layer 13 to electrically couple to the active region 122.

Moreover, as shown in FIG. 1C, the portion 142 extends in z direction to pass through an opening in the portion 13a of the isolation layer 13 to electrically couple to the active region 111.

In some embodiments, the isolation layer 13 includes, for example, silicon oxide, silicon nitride, silicon oxynitride (SiON), SiOCN, SiCN, fluorine-doped silicate glass (FSG), or dielectric material. However, the scope of the disclosure is not intended to be limiting of the present disclosure. For example, in various embodiments, the insulating material for the isolation layer 13 includes, for example, SiOCN, SiCN, or any kinds of suitable materials.

In some embodiments, the connection layer 14 is conductive, but includes a greater percentage of nonmetal material compared to metal material. For example, the connection layer 14 is formed of a semiconductor using ion implantation sufficient to convert the semiconductor into a conductor, e.g., highly silicon doped layer. In various embodiments, the connection layer 14 is a metal layer.

In some embodiments, the transistors 11-12 are both gate-all-around (GAA) FETs. For example, the gate structure 131 includes a gate dielectric layer (not shown) and a gate electrode layer (not shown). In some embodiments, as shown in FIG. 1D, the gate 131 is formed around channel regions 113 and 123 included in the active regions 111-112 and 121-122 of the transistors 11-12, in which the channel regions 113 and 123 include, for example, structures of round/square wire, nanoslab, nano-sheet, multi-bridge channel, nano-ring or any other suitable kinds of the nano structures. The materials for forming the channel regions 113 and 123 include one or more layers of Ge, GaAs, InSb, GaP, GaSb, InAlAs, InGaAs, GaSbP, GaAsSb or InP. The gate dielectric layer includes one or more layers of a dielectric material, such as silicon oxide, silicon nitride, or high-k dielectric material, other suitable dielectric material, and/or combinations thereof. Examples of high-k dielectric material include HfO2, HfSiO, HfSiON, HfTaO, HfTiO, HfZrO, zirconium oxide, aluminum oxide, titanium oxide, hafnium dioxide-alumina (HfO2-Al2O3) alloy, other suitable high-k dielectric materials, and/or combinations thereof. In some embodiments, the gate dielectric layer includes an interfacial layer formed between the channel layers and the dielectric material. In some embodiments, the connection layer 14 is coupled to the channel regions 113 and 123.

In some embodiments, the transistors 11 and 12 are of different conductivity types. For example, the transistor 11 is of N conductivity type and the transistor 12 is of P conductivity type. In various embodiments, the transistor 11 is of P conductivity type and the transistor 12 is of N conductivity type.

Figure 2:
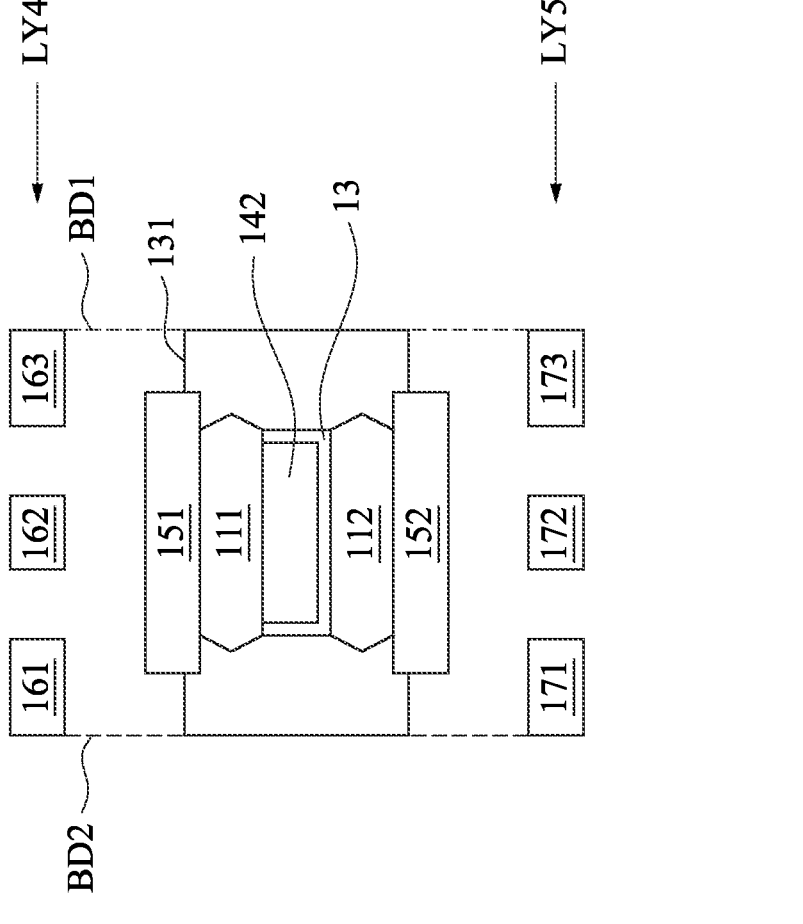
FIG. 2 is a schematic diagram of an integrated circuit corresponding to FIG. 1A in a cross-section view, in accordance with some embodiments.

Reference is now made to FIG. 2. FIG. 2 is a schematic diagram of the integrated circuit 10 corresponding to FIG. 1A in a cross-section view, in accordance with some embodiments. With respect to the embodiments of FIGS. 1A-1D, like elements in FIG. 2 are designated with the same reference numbers for ease of understanding. The specific operations of similar elements, which are already discussed in detail in above paragraphs, are omitted herein for the sake of brevity.

As shown in the embodiments of FIG. 2, the integrated circuit 10 further includes conductive segments (e.g., referred as to metal-on-device, MD) 151-152. The conductive segment 151 is formed on and contacts the active region 111. The conductive segment 152 is formed under and contacts the active region 121. Alternatively stated, the portion 142 of the connection layer 14 is disposed between the conductive segments 151 and 152.

For illustration, the gate structure 131 is formed between cell boundaries BD1-BD2. The integrated circuit 10 further includes conductive lines 161-162 and 171-173. In some embodiments, the conductive lines 161-163 are disposed in a fourth semiconductor layer above the first semiconductor layer and referred to as metal-zero (M0) layers formed on a front side of the integrated circuit 10 in the front side process. In some embodiments, the conductive lines 161-163 are configured to be utilized for front side metal routing to transmit signals and power for the transistor 11.

On the other hand, the conductive lines 171-173 are disposed in a fifth semiconductor layer below the second semiconductor layer and referred to as back metal-zero layers (BM0) formed on a backside of the integrated circuit 10 in the backside process. In some embodiments, the front side and the backside are opposite sides of the integrated circuit 10. In some embodiments, the conductive lines 171-173 are configured to be utilized for backside metal routing to transmit signals and power for the transistor 12.

In some embodiments, the active semiconductor device, for example, the transistors 11-12 the integrated circuit 10 are formed on a substrate (not shown) in a front side process. After the front side process is complete, the integrated circuit 10 is flipped upside down, such that a backside surface of the substrate faces upwards. The substrate is further thinned down and removed. In some embodiments, thinning is accomplished by a CMP process, a grinding process, or the like. Accordingly, backside process is performed to form structures on the backside of the integrated circuit 10.

Figures 3A, 3B, 3C:
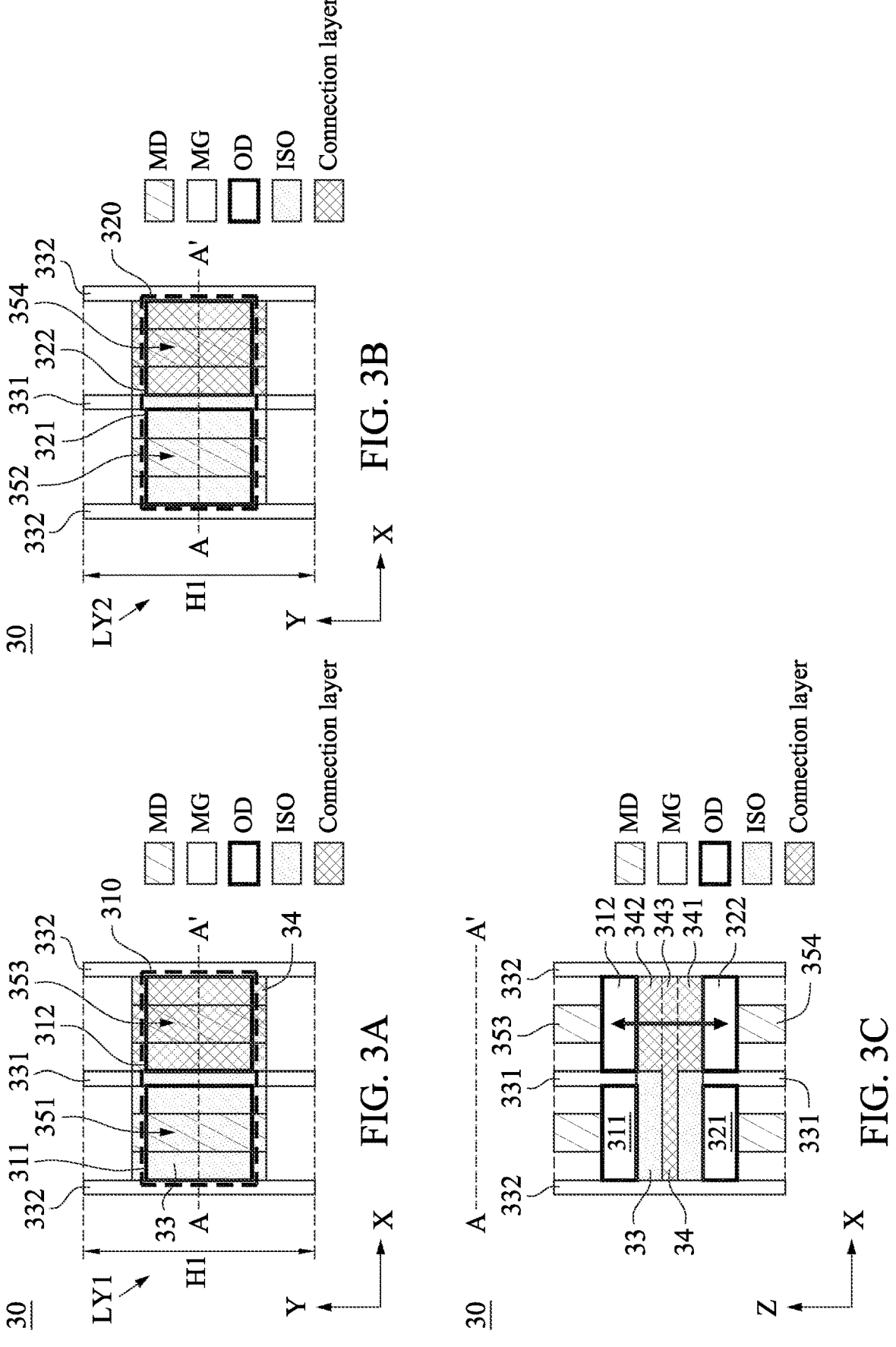
FIG. 3A is schematic layout diagram of part of a top layer in an integrated circuit, in accordance with some embodiments.
FIG. 3B is schematic layout diagram of part of a bottom layer in an integrated circuit, in accordance with some embodiments.
FIG. 3C is a schematic diagram of an integrated circuit corresponding to FIGS. 3A-3B in a cross-section view, in accordance with some embodiments.

Reference is now made to FIGS. 3A-3C. FIG. 3A is schematic layout diagram of part of a top layer in an integrated circuit 30, FIG. 3B is schematic layout diagram of part of a bottom layer in the integrated circuit 30, and FIG.

3C is a schematic diagram of the integrated circuit 30 corresponding to FIGS. 3A-3B in a cross-section view along a line AA', in accordance with some embodiments.

For illustration, as shown in FIG. 3A, the integrated circuit 30 includes an active area 310 having active regions 311-312 in the first semiconductor layer LY1 (top layer), gate structures 331-332, conductive segments 351 and 353, an isolation layer 33 and a connection layer 34. In some embodiments, the active area 310 is configured with respect to, for example, the active area 110 of FIG. 1A, the gate structure 331 is configured with respect to, for example, the gate structure 131 of FIG. 1A, the conductive segments 351 and 353 are configured with respect to, for example, the conductive segments 151-152 of FIG. 2, the isolation layer 33 is configured with respect to, for example, the isolation layer 13 of FIG. 1A, and the connection layer 34 is configured with respect to, for example, the connection layer 14 of FIG. 1A.

In the layout view, the gate structures 331-332 extend in y direction and the active area 310 extends in x direction to pass through the gate structure 331. The conductive segments 351 and 353 extend in y direction. Moreover, the connection layer 34 overlaps the active region 312 and the conductive segment 353.

For illustration, as shown in FIG. 3B, the integrated circuit 30 includes an active area 320 having active regions 321-322 in the second semiconductor layer LY2 (bottom layer), and conductive segments 352 and 354. In some embodiments, the active area 320 is configured with respect to, for example, the active area 120 of FIG. 1A, and the conductive segments 352 and 354 are configured with respect to, for example, the conductive segments 151-152 of FIG. 2.

In the layout view, the active area 320 extends in x direction to pass through the gate structure 331. The conductive segments 352 and 354 extend in y direction. Moreover, the connection layer 34 overlaps the active region 322 and the conductive segment 354.

In some embodiments, the active regions 311-312 are included in a structure operating as a transistor 31 configured with respect to, for example, the transistor 11 of FIG. 1A. The active regions 321-322 are included in a structure operating as a transistor 32 configured with respect to, for example, the transistor 12 of FIG. 1A. The gate structure 331 is shared by the transistors 31-32.

With reference to FIG. 3C, the connection layer 34 includes portions 341-343 that are configured with respect to, for example, the portions 141-143 of FIG. 1A. For example, the portion 341 contacts the active region 322, the portion 342 contacts the active region 312, and the portion 343 couples between the portions 341-342. Accordingly, the active regions 312 and 322 are electrically coupled with each other. In some embodiments, the portion 343 further extends in x direction between the active regions 311 and 321.

The configurations of FIGS. 3A-3C are given for illustrative purposes. Various implements are within the contemplated scope of the present disclosure. For example, in some embodiments, the connection layer 34 does not extend to be between the active regions 311 and 321.

Figures 4A, 4B:
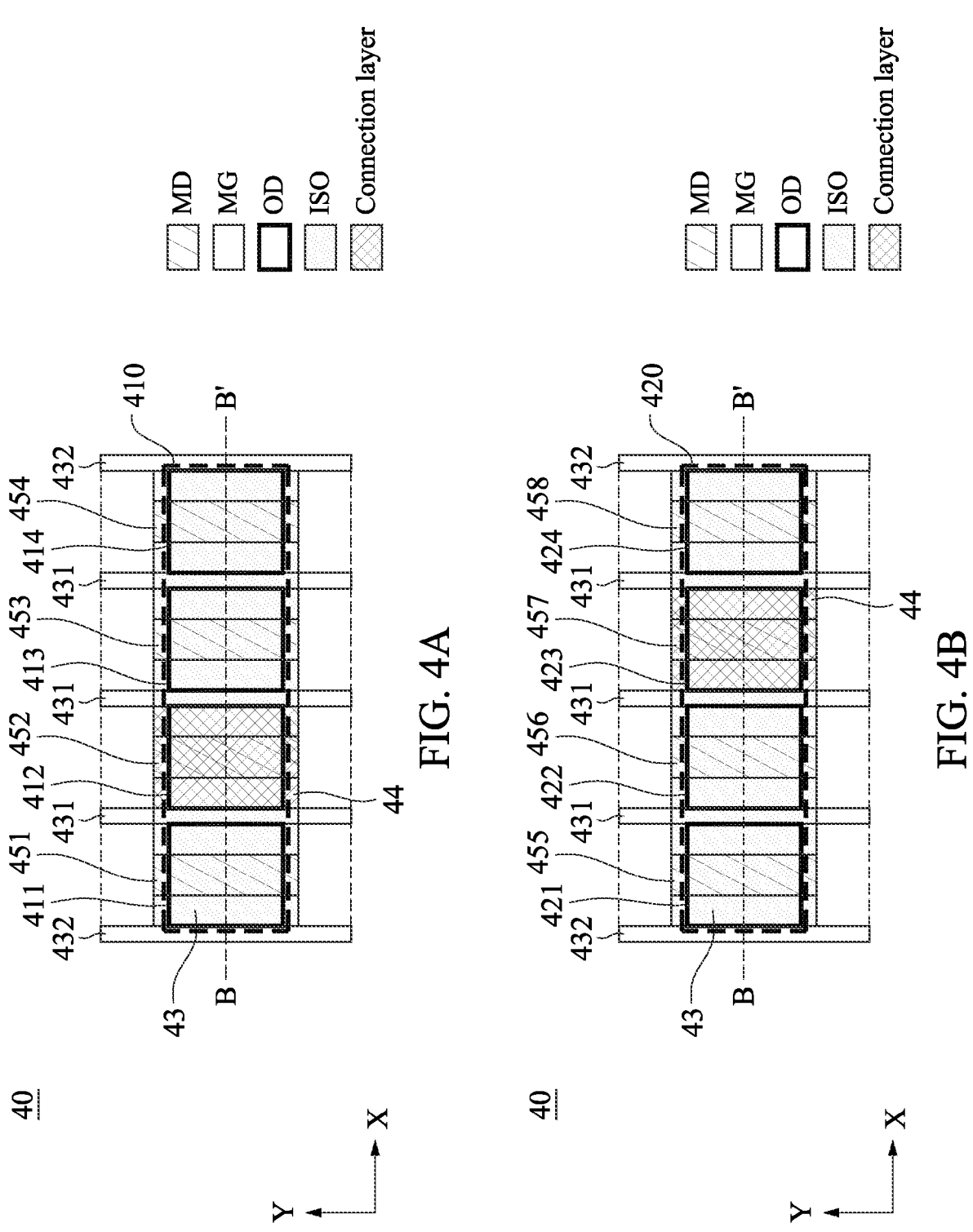
FIG. 4A is schematic layout diagram of part of a top layer in an integrated circuit, in accordance with some embodiments.
FIG. 4B is schematic layout diagram of part of a bottom layer in an integrated circuit, in accordance with some embodiments.
Figure 4C:
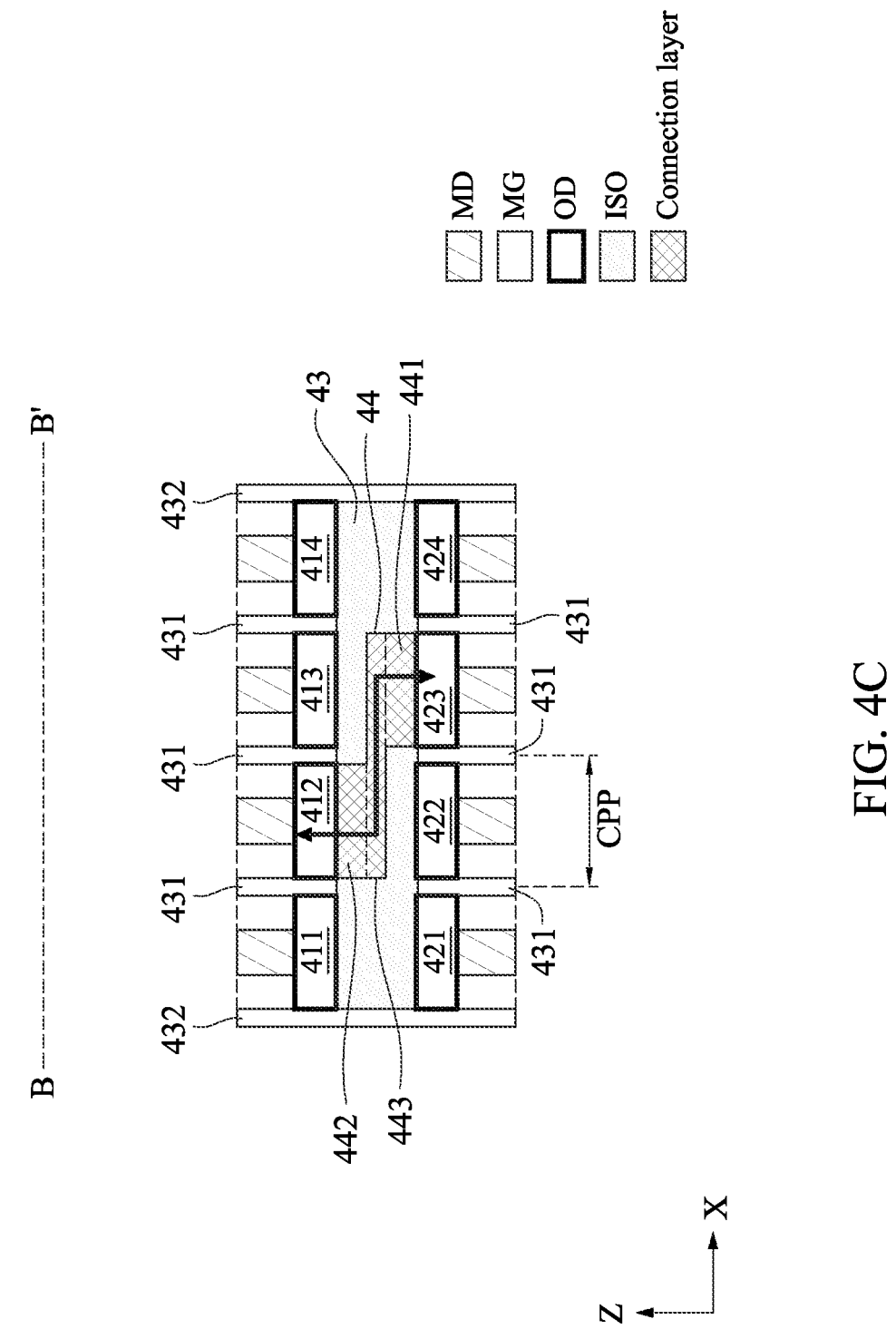
FIG. 4C is a schematic diagram of an integrated circuit corresponding to FIGS. 4A-4B in a cross-section view, in accordance with some embodiments.

Reference is now made to FIGS. 4A-4C. FIG. 4A is schematic layout diagram of part of a top layer in an integrated circuit 40, FIG. 4B is schematic layout diagram of part of a bottom layer in the integrated circuit 40, and FIG. 4C is a schematic diagram of the integrated circuit 40 corresponding to FIGS. 4A-4B in a cross-section view along a line BB', in accordance with some embodiments.

For illustration, as shown in FIG. 4A, the integrated circuit 40 includes an active area 410 having active regions 411-414 in the first semiconductor layer LY1 (top layer), gate structures 431-432, conductive segments 451-454, an isolation layer 43 and a connection layer 44. In some embodiments, the active area 410 is configured with respect to, for example, the active area 110 of FIG. 1A, the gate structures 431-432 are configured with respect to, for example, the gate structure 131 of FIG. 1A, the conductive segments 451-454 are configured with respect to, for example, the conductive segments 151-152 of FIG. 2, the isolation layer 43 is configured with respect to, for example, the isolation layer 13 of FIG. 1A, and the connection layer 44 is configured with respect to, for example, the connection layer 14 of FIG. 1A.

In the layout view, the gate structures 431-432 extend in y direction and the active area 410 extends in x direction to pass through the gate structure 431. In some embodiments, the gate structure 432 is referred to as a dummy gate, in which in some embodiments, the "dummy" gates are referred to as being not electrically connected as the gates for MOS devices, having no function in the circuit. The conductive segments 451-454 extend in y direction and disposed on the active regions 411-414 separately. Moreover, the connection layer 44 overlaps the active region 412 and the conductive segment 452 in the layout view.

For illustration, as shown in FIG. 4B, the integrated circuit 40 includes an active area 420 having active regions 421-424 in the second semiconductor layer LY2 (bottom layer), and conductive segments 455-458. In some embodiments, the active area 420 is configured with respect to, for example, the active area 120 of FIG. 1A, and the conductive segments 455-458 are configured with respect to, for example, the conductive segments 152 of FIG. 2.

In the layout view, the active area 420 extends in x direction to pass through the gate structure 431. The conductive segments 455-458 extend in y direction. Moreover, the connection layer 44 overlaps the active region 423 and the conductive segment 457.

In some embodiments, the active regions 411-414 are included in structures operating as transistors configured with respect to, for example, the transistor 11 of FIG. 1A. The active regions 421-424 are included in structures operating as transistors configured with respect to, for example, the transistor 12 of FIG. 1A.

With reference to FIG. 4C, the connection layer 44 includes portions 441-443 that are configured with respect to, for example, the portions 141-143 of FIG. 1A. For example, the portion 441 contacts the active region 423, the portion 442 contacts the active region 412, and the portion 443 couples between the portions 441-442. Accordingly, the active regions 423 and 412 are electrically coupled with each other. In some embodiments, the portion 443 further extends in x direction between the active regions 412-413 and 422-423 and extends across at least two poly pitches CPP, in which the poly pitch CPP refers to a pitch between two adjacent gate structures.

For illustration, the isolation layer 43 surrounds the connection layer 44 and isolates the connection layer 44 from the gate structures 431-432. In a cross-section view, the isolation layer 43 passed through the gate structure 431.

The configurations of FIGS. 4A-4C are given for illustrative purposes. Various implements are within the contemplated scope of the present disclosure. For example, in some embodiments, the isolation layer 43 does not pass through the gate structure 431 between active regions 411-412, 421-422 and also does not pass through the gate structure 431 between active regions 413-414, 423-424.

Figure 5A:
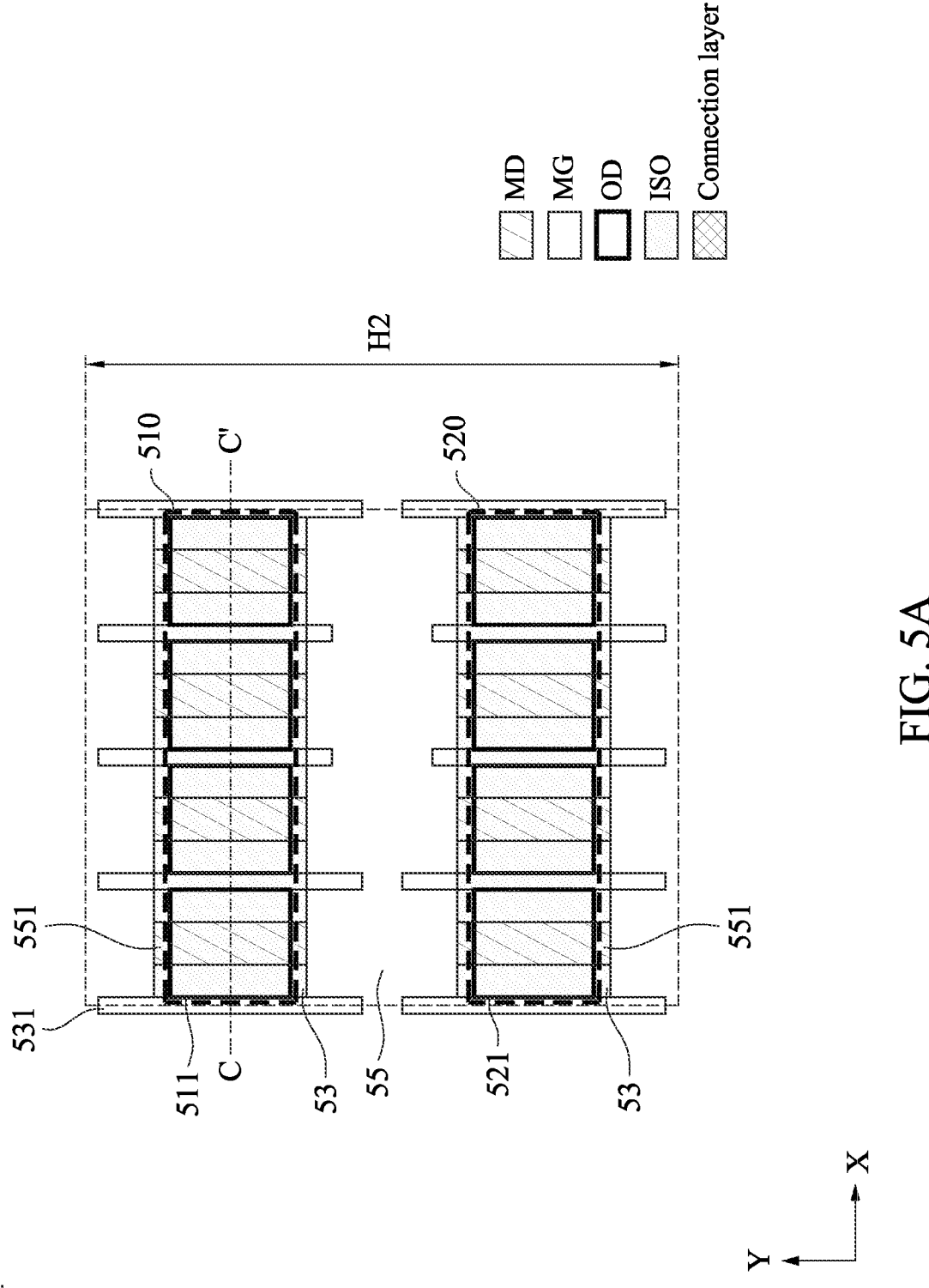
FIG. 5A is schematic layout diagram of part of a top layer in an integrated circuit, in accordance with some embodiments.
Figure 5B:
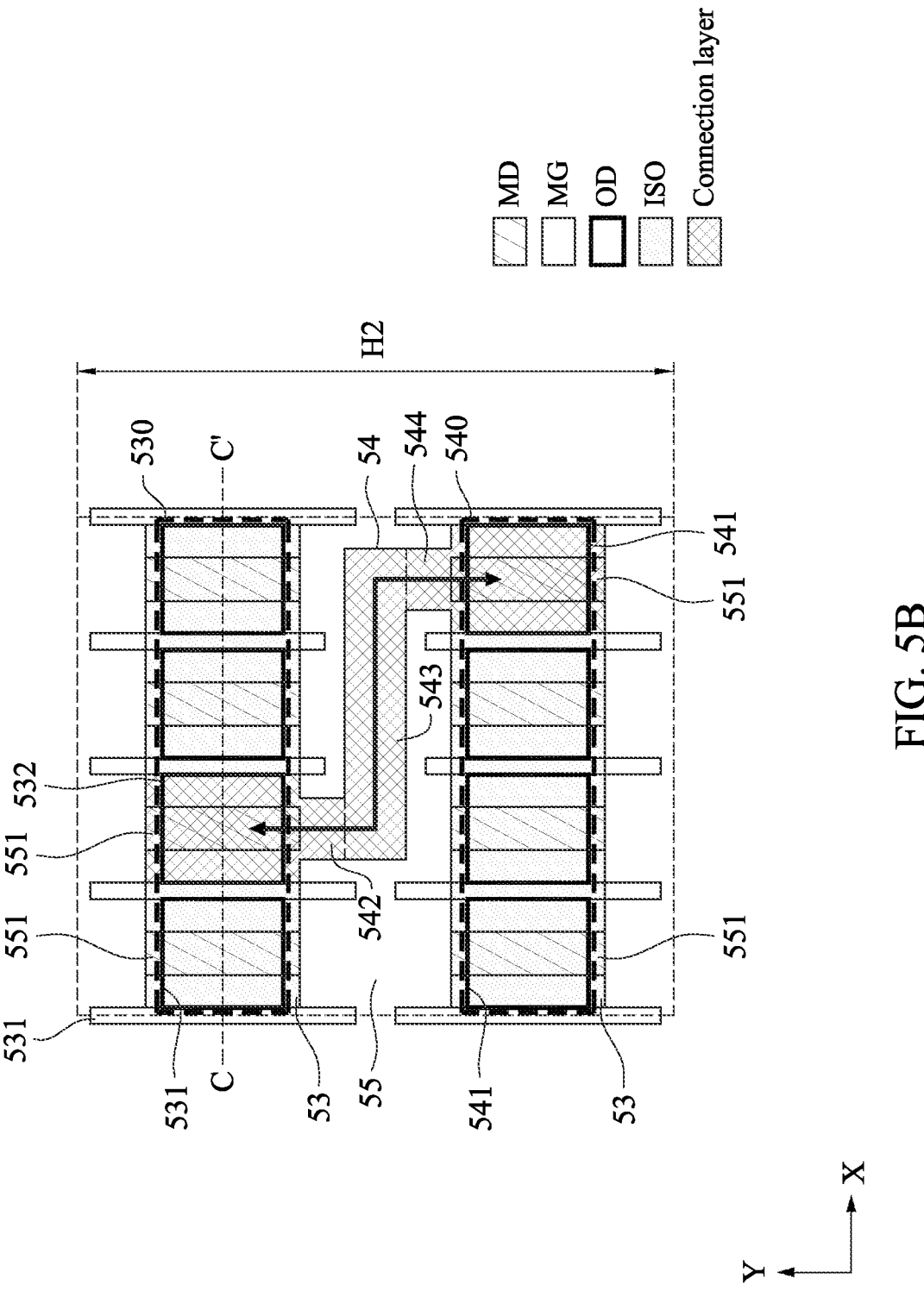
FIG. 5B is schematic layout diagram of part of a bottom layer in an integrated circuit, in accordance with some embodiments.

Reference is now made to FIGS. 5A-5C. FIG. 5A is schematic layout diagram of part of a top layer in an integrated circuit 50, FIG. 5B is schematic layout diagram of part of a bottom layer in the integrated circuit 50, and FIG. 5C is a schematic diagram of the integrated circuit 30 corresponding to FIGS. 5A-5B in a cross-section view along a line CC', in accordance with some embodiments.

For illustration, as shown in FIG. 5A, a cell of the integrated circuit 50 has a cell height H2 which is double of the cell height H1 in the cell of the integrated circuit 30. As shown in FIG. 5A, the integrated circuit 50 includes active areas 510,520 having active regions 511 and 521 in the first semiconductor layer LY1 (top layer) and gate structures 531 that overlap the active areas 510, 520. The integrated circuit further includes conductive segments 551, an isolation layer 53, and an isolation layer 55 arranged between the active areas 510 and 520. The conductive segments 551 are disposed on the active regions 511 and 521. In some embodiments, the active areas 510 and 520 are configured with respect to, for example, the active area 110 of FIG. 1A, the gate structures 531 are configured with respect to, for example, the gate structure 131 of FIG. 1A, the conductive segments 551 are configured with respect to, for example, the conductive segments 151-152 of FIG. 2, and the isolation layer 53 is configured with respect to, for example, the isolation layer 13 of FIG. 1A.

In the layout view, the gate structures 531 extend in y direction and the active areas 510 and 520 extend in x direction to pass through the gate structure 531. The conductive segments 551 extend in y direction. The isolation layer 53 overlaps the active regions 511 and 521.

For illustration, as shown in FIG. 5B, the integrated circuit 50 includes active areas 530, 540 having active regions 532 and 541 in the second semiconductor layer LY2 (bottom layer), conductive segments 551, and a connection layer 54. In some embodiments, the active areas 530, 540 are configured with respect to, for example, the active area 120 of FIG. 1A, and the conductive segments 551 of FIG. 5B are configured with respect to, for example, the conductive segments 152 of FIG. 2. The connection layer 54 is configured with respect to, for example, the connection layer 14 of FIG. 1A.

In the layout view, the active areas 530 and 540 extend in x direction to pass through the gate structure 531. Moreover, the connection layer 54 overlaps the active regions 532 and 541 and the conductive segment 551. Specifically, the connection layer 54 includes portions 542-544. The portions 542 and 544 extend in y direction, and the portion 543 extends in x direction to couple the portion 542 to the portion 544. In some embodiments, the portion 343 further extends across at least three poly pitches CPP, as shown in FIG. 5B.

In some embodiments, the active regions 511 and 521 are included in structures operating as transistors configured with respect to, for example, the transistor 11 of FIG. 1A. The active regions 532 and 541 are included in structures operating as transistors configured with respect to, for example, the transistor 12 of FIG. 1A.

With reference to FIG. 5C, the portion 542 contacts the active region 532.

The configurations of FIGS. 5A-5C are given for illustrative purposes. Various implements are within the contemplated scope of the present disclosure. For example, in some embodiments, the isolation layer 53 passes through the gate structure 531 in the cross-sectional view.

Figure 6A:
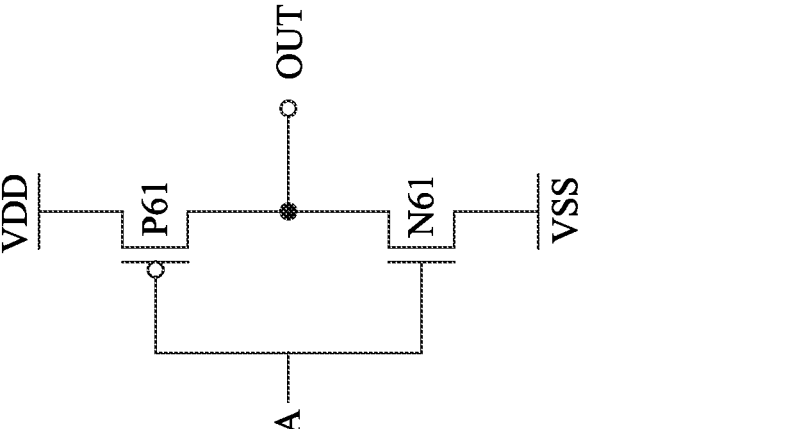
FIG. 6A is schematic circuit diagram of part of an integrated circuit, in accordance with some embodiments.

Reference is now made to FIG. 6A. FIG. 6A is schematic circuit diagram of part of an integrated circuit 60, in accordance with some embodiments. In some embodiments, the integrated circuit 60 is implemented as an inverter. For illustration, the integrated circuit 60 includes a P type transistor P61 and an N type transistor N61. A source of the transistor P61 is coupled to a voltage terminal providing a supply voltage VDD, a drain of the transistor P61 is coupled to a drain of the transistor N61 at an output terminal transmitting an output signal OUT, and gates of the transistors P61 and N61 are coupled together to receive a signal A. Source of the transistor N61 is coupled to a voltage terminal providing a supply voltage VSS (e.g., a ground potential).

Reference is now made to FIGS. 6B-6D. FIG. 6B is schematic layout diagram of part of a top layer in the integrated circuit 60 corresponding to FIG. 6A, FIG. 6C is schematic layout diagram of part of a bottom layer in the integrated circuit 60 corresponding to FIG. 6A, and FIG. 6D is a schematic diagram of the integrated circuit 60 corresponding to FIGS. 6A-6C in a cross-section view along a line DD', in accordance with some embodiments.

For illustration, as shown in FIG. 6B, the integrated circuit 60 includes an active area 610 having active regions 611-612 in the first semiconductor layer LY1 (top layer), gate structures 631-632, conductive segments 651 and 653, an isolation layer 63 and a connection layer 64. In some embodiments, the active area 610 is configured with respect to, for example, the active area 110 of FIG. 1A, the gate structure 631 is configured with respect to, for example, the gate structure 131 of FIG. 1A, the conductive segments 651 and 652 are configured with respect to, for example, the conductive segments 151-152 of FIG. 2, the isolation layer 63 is configured with respect to, for example, the isolation layer 13 of FIG. 1A, and the connection layer 64 is configured with respect to, for example, the connection layer 14 of FIG. 1A.

In some embodiments, the gate structure 631 corresponds to the gate of the transistors P61 and N61. The active region 611 and the conductive segment 651 correspond to the source of the transistor P61. The active region 612 and the conductive segment 652 correspond to the drain of the transistor P61. In some embodiments, the gate structures 632 are referred to as dummy gates.

In the layout view, the gate structures 631-632 extend in y direction and the active area 610 extends in x direction to pass through the gate structure 631. The conductive segments 651-652 extend in y direction. Moreover, the connection layer 64 overlaps the active region 612 and the conductive segment 652.

For illustration, as shown in FIG. 6C, the integrated circuit 60 includes an active area 620 having active regions 621-622 in the second semiconductor layer LY2 (bottom layer), and conductive segments 653 and 654. In some embodiments, the active area 620 is configured with respect to, for example, the active area 120 of FIG. 1A, and the conductive segments 653-654 are configured with respect to, for example, the conductive segments 151-152 of FIG. 2.

In the layout view, the active area 620 extends in x direction to pass through the gate structure 631. The conductive segments 653-654 extend in y direction. Moreover, the connection layer 64 overlaps the active region 622 and the conductive segment 654.

In some embodiments, the active region 621 and the conductive segment 653 correspond to the source of the transistor N61. The active region 622 and the conductive segment 654 correspond to the drain of the transistor N61.

With reference to FIG. 6D, the connection layer 64 includes portions 641-643 that are configured with respect to, for example, the portions 141-143 of FIG. 1A. For example, the portion 641 contacts the active region 622, the portion 642 contacts the active region 612, and the portion 643 couples between the portions 641-642. Accordingly, the active regions 612 and 622 are electrically coupled with each other. In some embodiments, the portion 643 further extends in x direction between the active regions 611 and 621.

The integrated circuit 60 further includes a conductive line 661 and a conductive line 671. The conductive line 661 is configured with respect to, for example, the conductive line 161 of FIG. 2 and formed at the front side of the integrated circuit 60. The conductive line 671 is configured with respect to, for example, the conductive line 171 of FIG. 2 and formed at the backside of the integrated circuit 60. In some embodiments, the conductive line 661 is configured to provide the supply voltage VSS to the integrated circuit 60 through coupling to the conductive segment 651 and the active region 611. Similarly, the conductive line 671 is configured to provide the supply voltage VDD to the integrated circuit 60 through coupling to the conductive segment 653 and the active region 621.

The configurations of FIGS. 6A-6D are given for illustrative purposes. Various implements are within the contemplated scope of the present disclosure. For example, in some embodiments, the connection layer 64 does not extend to be between the active regions 611 and 621.

Figure 7A:
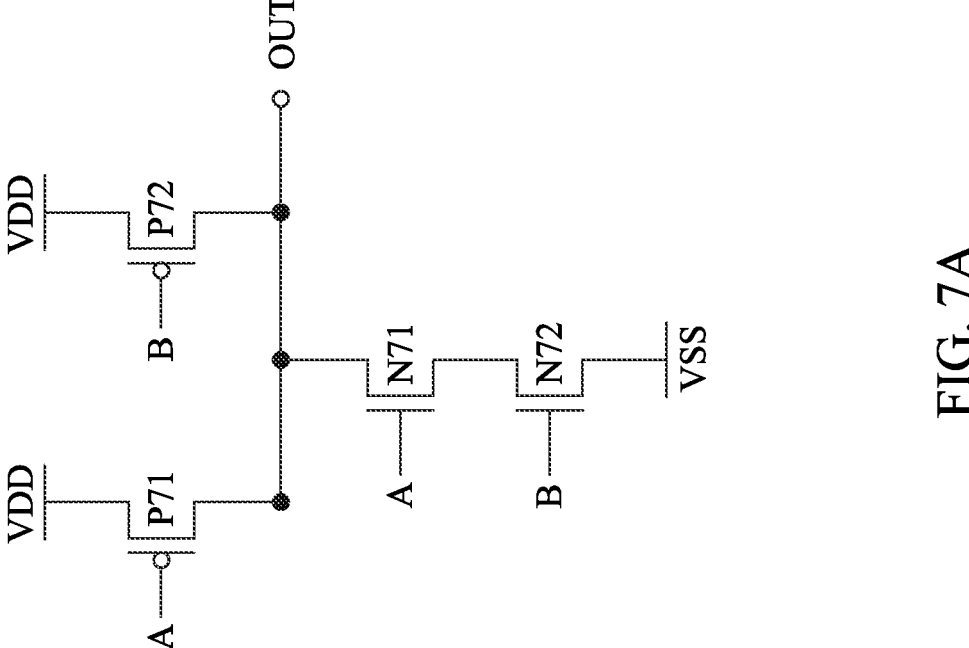
FIG. 7A is schematic circuit diagram of part of an integrated circuit, in accordance with some embodiments.

Reference is now made to FIG. 7A. FIG. 7A is schematic circuit diagram of part of an integrated circuit 70, in accordance with some embodiments. In some embodiments, the integrated circuit 70 is implemented as an NAND gate logic circuit. For illustration, the integrated circuit 70 includes P type transistor P71-P72 and N type transistors N71-N72. Sources of the transistors P71-P72 are coupled to the voltage terminal providing the supply voltage VDD. Drains of the transistors P71-P72 are coupled to drains of the transistor N71 at an output terminal transmitting an output signal OUT. Gates of the transistors P71 and N71 are coupled together to receive a signal A. Gates of the transistors P72 and N72 are coupled together to receive a signal B. A source of the transistor N72 is coupled to the voltage terminal providing the supply voltage VSS. A drain of the transistor N72 is coupled to a source of the transistor N71.

Figures 7B, 7C, 7D:
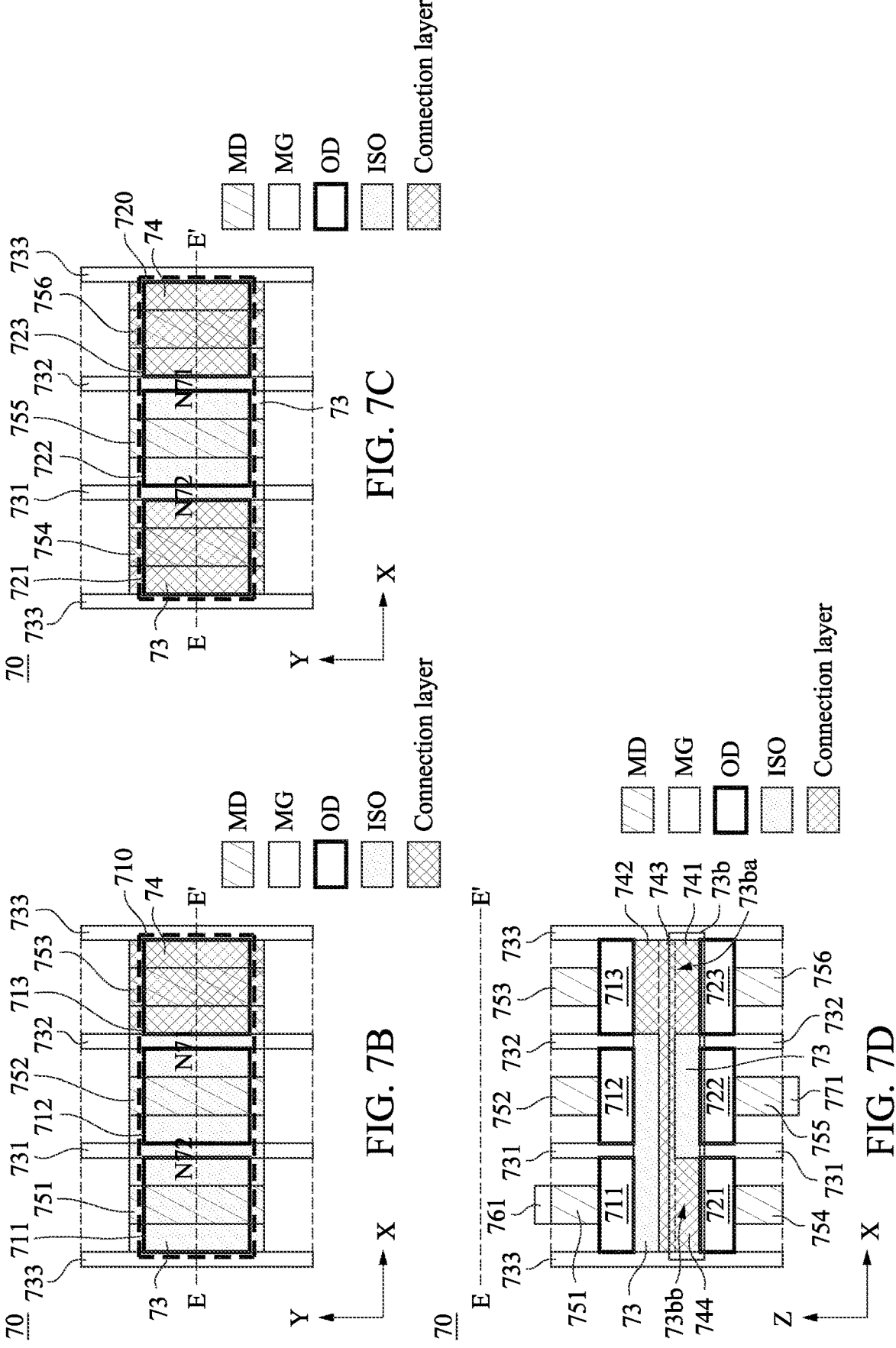
FIG. 7B is schematic layout diagram of part of a top layer in an integrated circuit corresponding to FIG. 7A, in accordance with some embodiments.
FIG. 7C is schematic layout diagram of part of a bottom layer in an integrated circuit corresponding to FIG. 7A, in accordance with some embodiments.
FIG. 7D is a schematic diagram of an integrated circuit corresponding to FIGS. 7A-7C in a cross-section view, in accordance with some embodiments.

Reference is now made to FIGS. 7B-7D. FIG. 7B is schematic layout diagram of part of a top layer in the integrated circuit 70 corresponding to FIG. 7A, FIG. 7C is schematic layout diagram of part of a bottom layer in the integrated circuit 70 corresponding to FIG. 7A, and FIG. 7D is a schematic diagram of the integrated circuit 70 corresponding to FIGS. 7A-7C in a cross-section view along a line EE', in accordance with some embodiments.

For illustration, as shown in FIG. 7B, the integrated circuit 70 includes an active area 710 having active regions 711-713 in the first semiconductor layer LY1 (top layer), gate structures 731-733, conductive segments 751-753, an isolation layer 73 and a connection layer 74. In some embodiments, the active area 710 is configured with respect to, for example, the active area 110 of FIG. 1A, the gate structures 731-732 are configured with respect to, for example, the gate structure 131 of FIG. 1A, the conductive segments 751-753 are configured with respect to, for example, the conductive segments 151-152 of FIG. 2, the isolation layer 73 is configured with respect to, for example, the isolation layer 13 of FIG. 1A, and the connection layer 74 is configured with respect to, for example, the connection layer 14 of FIG. 1A.

In some embodiments, the gate structure 731 corresponds to the gates of the transistors P72 and N72. The gate structure 732 corresponds to the gates of the transistors P71 and N71. The active region 711 and the conductive segment 751 correspond to the source of the transistor N72. The active region 712 and the conductive segment 752 correspond to the drain of the transistor N72 and the source of the transistor N71. The active region 713 and the conductive segment 753 correspond to the drain of the transistor N71. In some embodiments, the gate structures 733 are referred to as dummy gates.

In the layout view, the gate structures 731-733 extend in y direction and the active area 710 extends in x direction to pass through the gate structures 731-732. The conductive segments 751-753 extend in y direction. Moreover, the connection layer 74 overlaps the active region 713 and the conductive segment 753.

For illustration, as shown in FIG. 7C, the integrated circuit 70 includes an active area 720 having active regions 721-723 in the second semiconductor layer LY2 (bottom layer), and conductive segments 754-756. In some embodiments, the active area 720 is configured with respect to, for example, the active area 120 of FIG. 1A, and the conductive segments 754-756 are configured with respect to, for example, the conductive segments 151-152 of FIG. 2.

In the layout view, the active area 720 extends in x direction to pass through the gate structures 731-732. The conductive segments 754-756 extend in y direction. Moreover, the connection layer 74 overlaps the active regions 721, 723 and the conductive segment 754, 756.

In some embodiments, the active region 721 and the conductive segment 754 correspond to the drain of the transistor P72. The active region 722 and the conductive segment 755 correspond to the sources of the transistors P71-P72. The active region 723 and the conductive segment 756 correspond to the drain of the transistor P71.

In FIG. 7D, the isolation layer 73 is sandwiched between the transistors P71 and N71, and further sandwiched between the transistors P72 and N72. The isolation layer 73 is configured to isolate the connection layer 74 from the gate structures 731-733.

In some embodiments, the connection layer 74 is configured to connect P-type active region(s) to N-type active region(s) and referred to as a signal jumper. Specifically, with reference to FIG. 7D, the connection layer 74 includes portions 741-744 that are configured with respect to, for example, the portions 141-143 of FIG. 1A. Specifically, the portions 741-742 and 744 extend in z direction, and the portion 743 extends in x direction. For example, the portion 741 contacts the active region 723, the portion 742 contacts the active region 713, the portion 744 contacts the active region 721, and the portion 743 couples the portions 741-742 and 744. Accordingly, the active regions 713, 723 and 721 are electrically coupled with each other.

The integrated circuit 70 further includes a conductive line 761 and a conductive line 771. The conductive line 761 is configured with respect to, for example, the conductive line 161 of FIG. 2 and formed at the front side of the integrated circuit 70. The conductive line 771 is configured with respect to, for example, the conductive line 171 of FIG. 2 and formed at the backside of the integrated circuit 70. In some embodiments, the conductive line 761 is configured to provide the supply voltage VSS to the integrated circuit 70 through coupling to the conductive segment 751 and the active region 711. Similarly, the conductive line 771 is configured to provide the supply voltage VDD to the integrated circuit 70 through coupling to the conductive segment 755 and the active region 722.

The configurations of FIGS. 7A-7D are given for illustrative purposes. Various implements are within the contemplated scope of the present disclosure. For example, in some embodiments, instead of the connection layer 74 having the extending portions 741-742 and 744 to contact the active regions, the active regions 713, 721, and 723 extend in z direction into the isolation layer 73 to contact the portion 743.

Figure 8A:
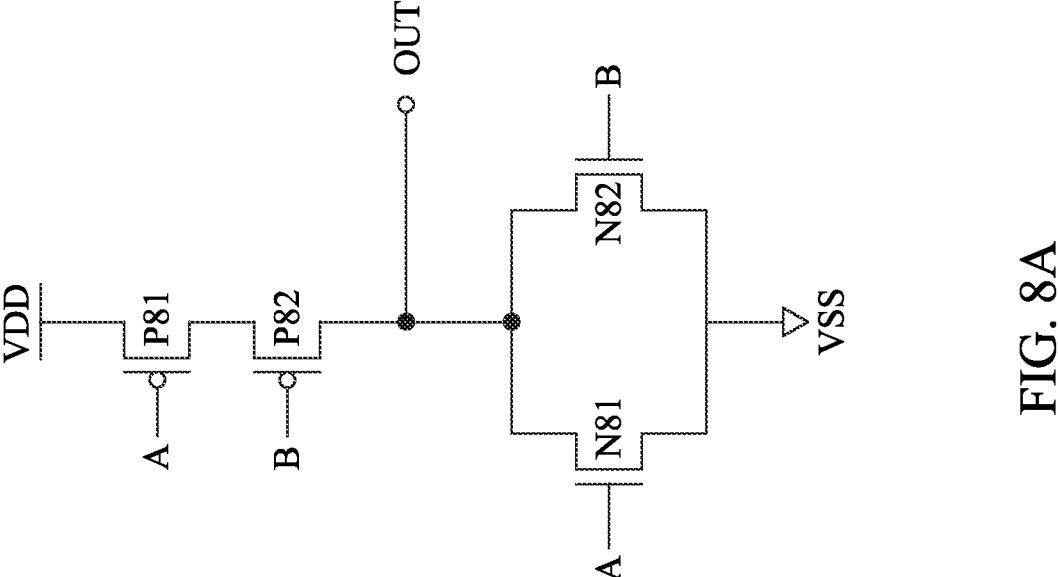
FIG. 8A is schematic circuit diagram of part of an integrated circuit, in accordance with some embodiments.

Reference is now made to FIG. 8A. FIG. 8A is schematic circuit diagram of part of an integrated circuit 80, in accordance with some embodiments. In some embodiments, the integrated circuit 80 is implemented as an NOR gate logic circuit. For illustration, the integrated circuit 80 includes P type transistor P81-P82 and N type transistors N81-N82. Sources of the transistors N81-N82 are coupled to the voltage terminal providing the supply voltage VSS. Drains of the transistors N81-N82 are coupled to drains of the transistor P82 at an output terminal transmitting an output signal OUT. Gates of the transistors P81 and N81 are coupled together to receive a signal A. Gates of the transistors P82 and N82 are coupled together to receive a signal B. A source of the transistor P81 is coupled to the voltage terminal providing the supply voltage VDD. A drain of the transistor P81 is coupled to a source of the transistor P82.

Figures 8B, 8C, 8D:
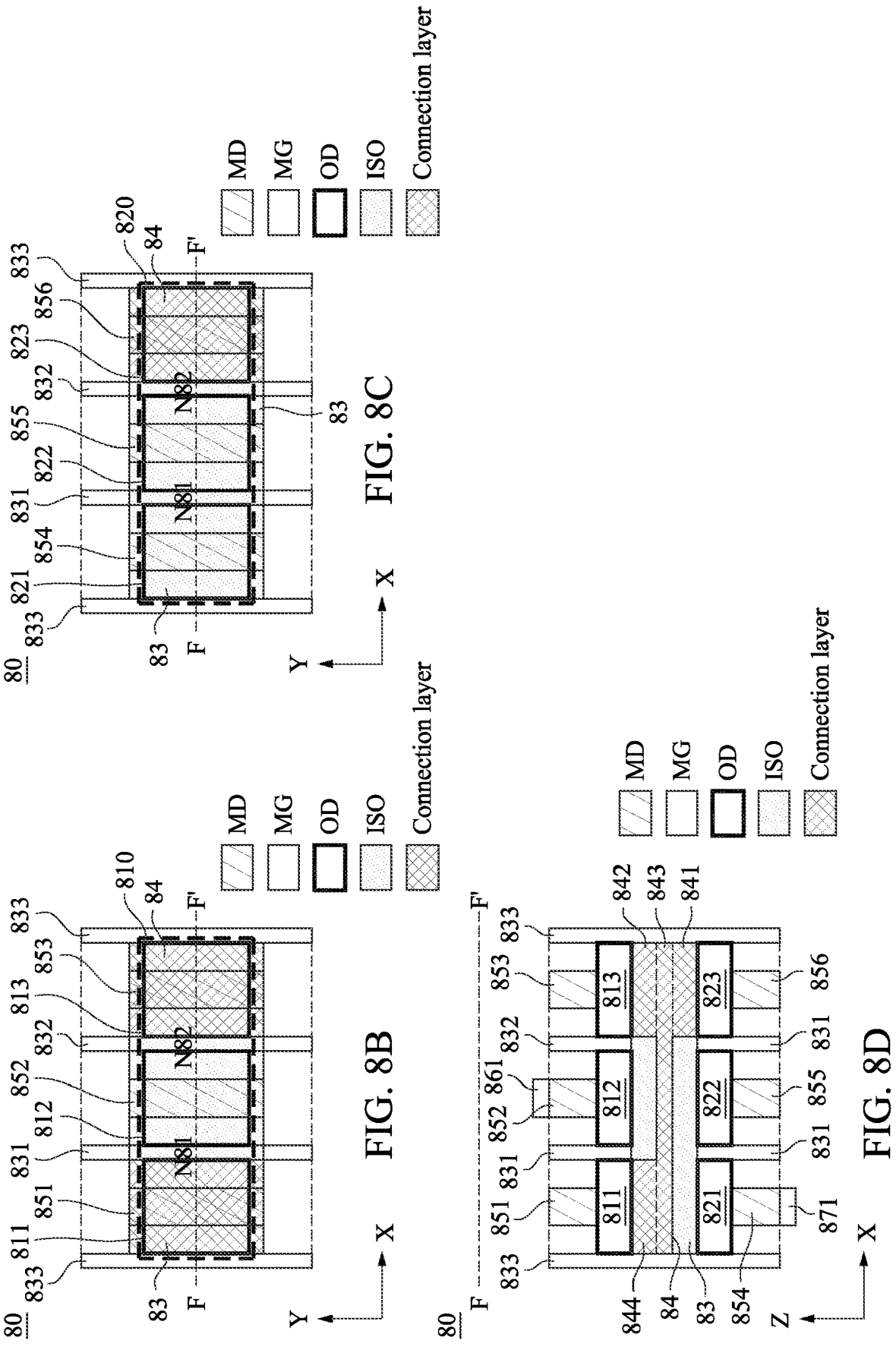
FIG. 8B is schematic layout diagram of part of a top layer in an integrated circuit corresponding to FIG. 8A, in accordance with some embodiments.
FIG. 8C is schematic layout diagram of part of a bottom layer in an integrated circuit corresponding to FIG. 8A, in accordance with some embodiments.
FIG. 8D is a schematic diagram of an integrated circuit corresponding to FIGS. 8A-8C in a cross-section view, in accordance with some embodiments.

Reference is now made to FIGS. 8B-8D. FIG. 8B is schematic layout diagram of part of a top layer in the integrated circuit 80 corresponding to FIG. 8A, FIG. 8C is schematic layout diagram of part of a bottom layer in the integrated circuit 80 corresponding to FIG. 8A, and FIG. 8D is a schematic diagram of the integrated circuit 80 corresponding to FIGS. 8A-8C in a cross-section view along a line FF', in accordance with some embodiments.

For illustration, as shown in FIG. 8B, the integrated circuit 80 includes an active area 810 having active regions 811-813 in the first semiconductor layer LY1 (top layer), gate structures 831-833, conductive segments 851-853, an isolation layer 83 and a connection layer 84. In some embodiments, the active area 810 is configured with respect to, for example, the active area 110 of FIG. 1A, the gate structures 831-832 are configured with respect to, for example, the gate structure 131 of FIG. 1A, the conductive segments 851-853 are configured with respect to, for example, the conductive segments 151-152 of FIG. 2, the isolation layer 83 is configured with respect to, for example, the isolation layer 13 of FIG. 1A, and the connection layer 84 is configured with respect to, for example, the connection layer 14 of FIG. 1A.

In some embodiments, the gate structure 831 corresponds to the gates of the transistors P81 and N81. The gate structure 832 corresponds to the gates of the transistors P82 and N82. The active region 811 and the conductive segment 851 correspond to the drain of the transistor N81. The active region 812 and the conductive segment 852 correspond to the source of the transistor N81-N82. The active region 813 and the conductive segment 853 correspond to the drain of the transistor N82. In some embodiments, the gate structures 833 are referred to as dummy gates.

In the layout view, the gate structures 831-833 extend in y direction and the active area 810 extends in x direction to pass through the gate structures 831-832. The conductive segments 851-853 extend in y direction. Moreover, the connection layer 84 overlaps the active regions 811,813 and the conductive segments 851,853.

For illustration, as shown in FIG. 8C, the integrated circuit 80 includes an active area 820 having active regions 821-823 in the second semiconductor layer LY2 (bottom layer), and conductive segments 854-856. In some embodiments, the active area 820 is configured with respect to, for example, the active area 120 of FIG. 1A, and the conductive segments 854-856 are configured with respect to, for example, the conductive segments 151-152 of FIG. 2.

In the layout view, the active area 820 extends in x direction to pass through the gate structures 831-832. The conductive segments 854-856 extend in y direction. Moreover, the connection layer 84 overlaps the active region 823 and the conductive segment 856.

In some embodiments, the active region 821 and the conductive segment 854 correspond to the source of the transistor P81. The active region 822 and the conductive segment 855 correspond to the drains of the transistors P81-P82. The active region 823 and the conductive segment 856 correspond to the drain of the transistor P82.

In FIG. 8D, the isolation layer 83 is sandwiched between the transistors P81 and N81, and further sandwiched between the transistors P82 and N82. The isolation layer 83 is configured to isolate the connection layer 84 from the gate structures 831-833.

In some embodiments, the connection layer 84 is configured to connect P-type active region(s) to N-type active region(s) and referred to as a signal jumper. Specifically, with reference to FIG. 8D, the connection layer 84 includes portions 841-844 that are configured with respect to, for example, the portions 141-143 of FIG. 1A. Specifically, the portions 841-842 and 844 extend in z direction, and the portion 843 extends in x direction. For example, the portion 841 contacts the active region 823, the portion 842 contacts the active region 813, the portion 844 contacts the active region 811, and the portion 843 couples the portions 841-842 and 844. Accordingly, the active regions 813, 823 and 811 are electrically coupled with each other.

The integrated circuit 80 further includes a conductive line 861 and a conductive line 881. The conductive line 861 is configured with respect to, for example, the conductive line 161 of FIG. 2 and formed at the front side of the integrated circuit 80. The conductive line 881 is configured with respect to, for example, the conductive line 181 of FIG. 2 and formed at the backside of the integrated circuit 80. In some embodiments, the conductive line 861 is configured to provide the supply voltage VSS to the integrated circuit 80 through coupling to the conductive segment 851 and the active region 811. Similarly, the conductive line 881 is configured to provide the supply voltage VDD to the integrated circuit 80 through coupling to the conductive segment 855 and the active region 822.

The configurations of FIGS. 8A-8D are given for illustrative purposes. Various implements are within the contemplated scope of the present disclosure. For example, in some embodiments, instead of the connection layer 84 having the extending portions 841-842 and 844 to contact the active regions, the active regions 813, 811, and 823 extend in z direction into the isolation layer 83 to contact the portion 843.

Figure 9A:
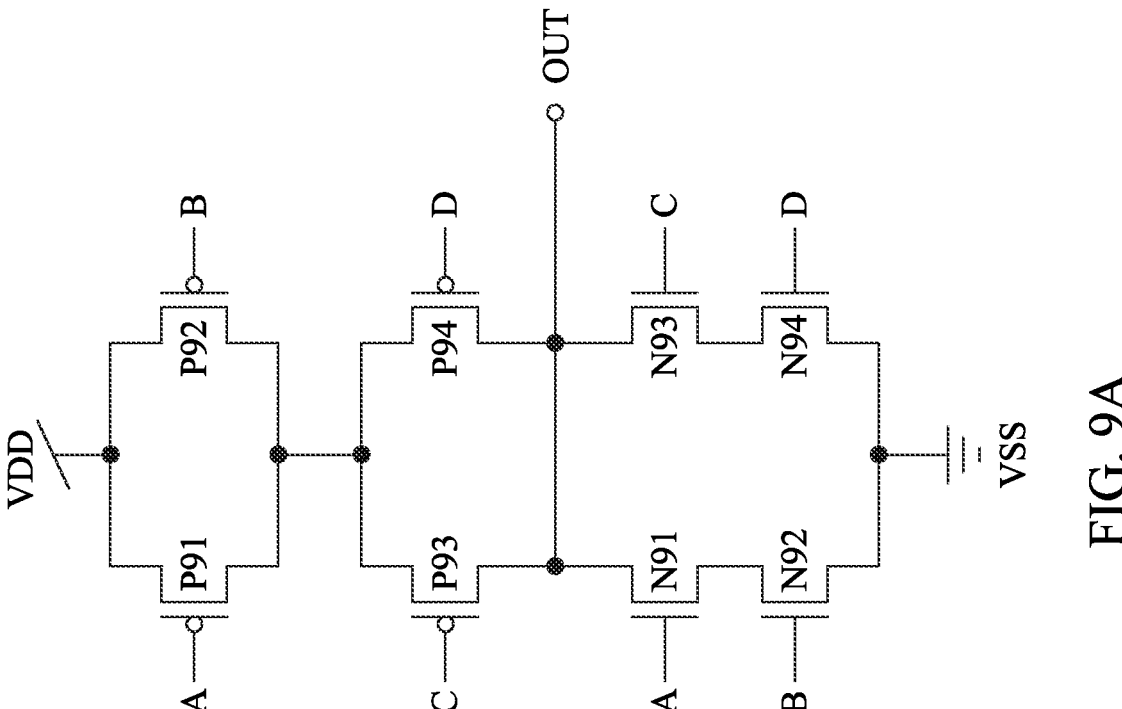
FIG. 9A is schematic circuit diagram of part of an integrated circuit, in accordance with some embodiments.

Reference is now made to FIG. 9A. FIG. 9A is schematic circuit diagram of part of an integrated circuit 90, in accordance with some embodiments. In some embodiments, the integrated circuit 90 is implemented as an AND-OR-invert (AOI22) logic circuit. For illustration, the integrated circuit 90 includes P type transistor P91-P94 and N type transistors N91-N94. Sources of the transistors P91-P92 are coupled to the voltage terminal providing the supply voltage VDD.

Drains of the transistors P91-P92 are coupled to sources of the transistors P93-94. Drains of the transistors P93-94 are coupled to drains of the transistors N91 and N93 at an output terminal transmitting an output signal OUT. Sources of the transistors N92 and N94 are coupled to the voltage terminal providing the supply voltage VSS. Drains of the transistors P92 and P94 are coupled to sources of the transistors P91 and P93 respectively. Gates of the transistors P91 and N91 are coupled together to receive a signal A. Gates of the transistors P92 and N92 are coupled together to receive a signal B. Gates of the transistors P93 and N93 are coupled together to receive a signal C. Gates of the transistors P94 and N94 are coupled together to receive a signal D.

Figures 9B, 9C:
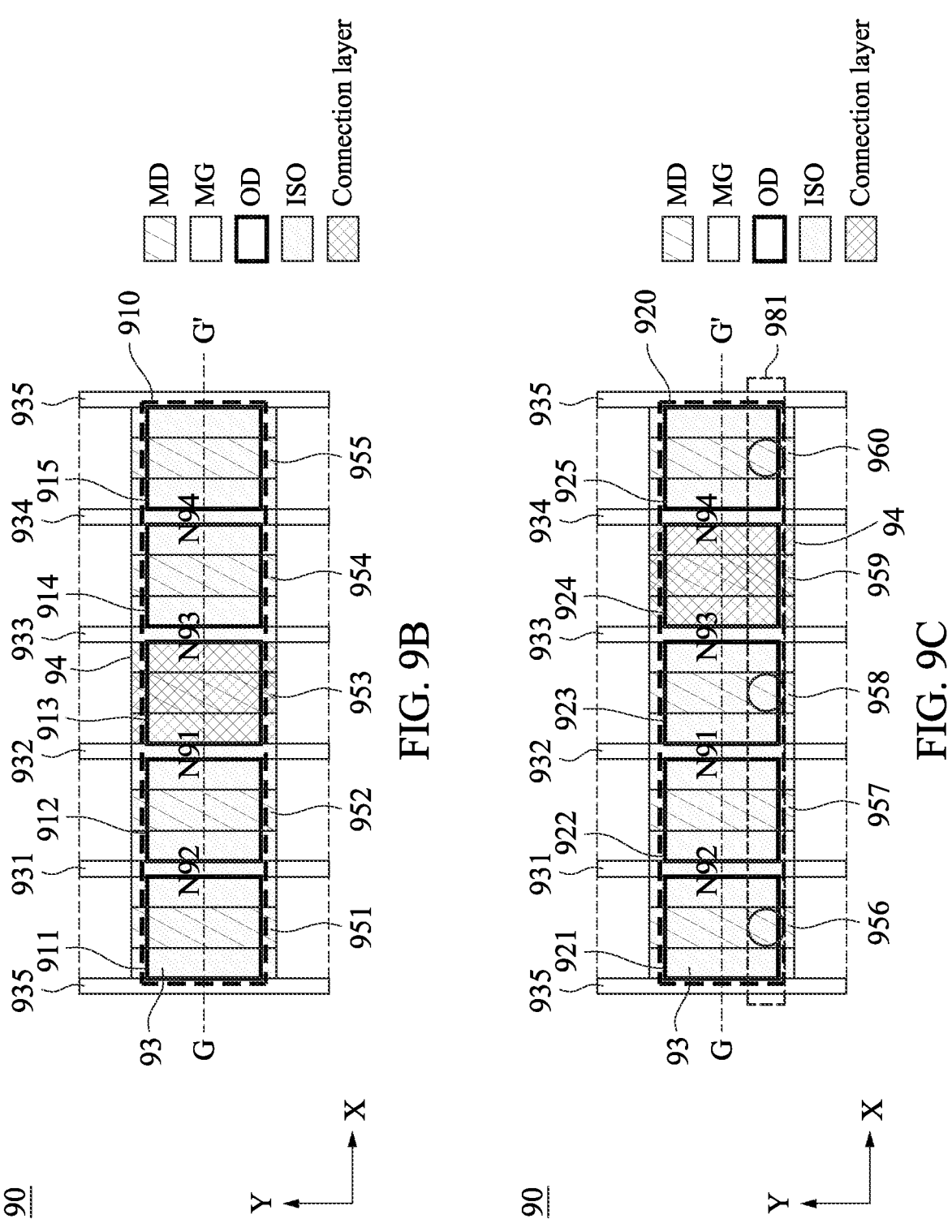
FIG. 9B is schematic layout diagram of part of a top layer in an integrated circuit corresponding to FIG. 9A, in accordance with some embodiments.
FIG. 9C is schematic layout diagram of part of a bottom layer in an integrated circuit corresponding to FIG. 9A, in accordance with some embodiments.

Reference is now made to FIGS. 9B-9D. FIG. 9B is schematic layout diagram of part of a top layer in the integrated circuit 90 corresponding to FIG. 9A, FIG. 9C is schematic layout diagram of part of a bottom layer in the integrated circuit 90 corresponding to FIG. 9A, and FIG. 9D is a schematic diagram of the integrated circuit 90 corresponding to FIGS. 9A-9C in a cross-section view along a line GG', in accordance with some embodiments.

For illustration, as shown in FIG. 9B, the integrated circuit 90 includes an active area 910 having active regions 911-915 in the first semiconductor layer LY1 (top layer), gate structures 931-935, conductive segments 951-955, an isolation layer 93 and a connection layer 94. In some embodiments, the active area 910 is configured with respect to, for example, the active area 110 of FIG. 1A, the gate structures 931-935 are configured with respect to, for example, the gate structure 131 of FIG. 1A, the conductive segments 951-955 are configured with respect to, for example, the conductive segments 151-152 of FIG. 2, the isolation layer 93 is configured with respect to, for example, the isolation layer 13 of FIG. 1A, and the connection layer 94 is configured with respect to, for example, the connection layer 14 of FIG. 1A.

In some embodiments, the gate structure 931 corresponds to the gates of the transistors P92 and N92. The gate structure 932 corresponds to the gates of the transistors P91 and N91. The gate structure 933 corresponds to the gates of the transistors P93 and N93. The gate structure 934 corresponds to the gates of the transistors P94 and N94.

The active region 911 and the conductive segment 951 correspond to the source of the transistor N92. The active region 912 and the conductive segment 952 correspond to the drain of the transistor N92 and the source of the transistor N91. The active region 913 and the conductive segment 953 correspond to the drains of the transistors N91 and N93. The active region 914 and the conductive segment 954 correspond to the drain of the transistors N94 and the source of the transistor N93. The active region 915 and the conductive segment 955 correspond to the source of the transistor N94. In some embodiments, the gate structures 935 are referred to as dummy gates.

In the layout view, the gate structures 931-935 extend in y direction and the active area 910 extends in x direction to pass through the gate structures 931-934. The conductive segments 951-955 extend in y direction. Moreover, the connection layer 94 overlaps the active region 913 and the conductive segment 953.

For illustration, as shown in FIG. 9C, the integrated circuit 90 includes an active area 920 having active regions 921-925 in the second semiconductor layer LY2 (bottom layer), and conductive segments 956-960. In some embodiments, the active area 920 is configured with respect to, for example, the active area 120 of FIG. 1A, and the conductive segments 956-960 are configured with respect to, for example, the conductive segments 151-152 of FIG. 2.

In the layout view, the active area 920 extends in x direction to pass through the gate structures 931-934. The conductive segments 956-960 extend in y direction. Moreover, the connection layer 94 overlaps the active region 924 and the conductive segment 959.

In some embodiments, the active region 921 and the conductive segment 956 correspond to the drain of the transistor P92. The active region 922 and the conductive segment 957 correspond to the sources of the transistor P92 and 91. The active region 923 and the conductive segment 958 correspond to the drain of the transistors P91 and the source of the transistor P93. The active region 924 and the conductive segment 959 correspond to the drains of the transistors N93 and the transistor P94. The active region 925 and the conductive segment 960 correspond to the source of the transistor P94.

As shown in FIG. 9C, in some embodiments, the integrated circuit 90 further includes a conductive trace 981 formed at the backside of the integrated circuit 90. The conductive trace 981 is configured to couple the active regions 921, 923, and 925 together through contacts disposed under the conductive segments 956, 958, and 960.

In FIG. 9D, the isolation layer 93 is sandwiched between corresponding two transistors disposed in the first and second semiconductor layers LY1-LY2.

In some embodiments, the connection layer 94 is configured to connect P-type active region(s) to N-type active region(s) and referred to as a signal jumper. Specifically, with reference to FIG. 9D, the connection layer 94 includes portions 941-943 that are configured with respect to, for example, the portions 141-143 of FIG. 1A. Specifically, the portions 941-942 extend in z direction, and the portion 943 extends in x direction. For example, the portion 941 contacts the active region 924, the portion 942 contacts the active region 913, and the portion 943 couples the portions 941-942. Accordingly, the active regions 913 and 924 are electrically coupled with each other.

The integrated circuit 90 further includes conductive lines 961-962 and a conductive line 971. The conductive lines 961-962 are configured with respect to, for example, the conductive line 161 of FIG. 2 and formed at the front side of the integrated circuit 90. The conductive line 971 is configured with respect to, for example, the conductive line 191 of FIG. 2 and formed at the backside of the integrated circuit 90. In some embodiments, the conductive lines 961-962 is configured to provide the supply voltage VSS to the integrated circuit 90 through coupling to the conductive segments 951,955 and the active regions 911,915. Similarly, the conductive line 971 is configured to provide the supply voltage VDD to the integrated circuit 90 through coupling to the conductive segment 957 and the active region 922.

The configurations of FIGS. 9A-9D are given for illustrative purposes. Various implements are within the contemplated scope of the present disclosure. For example, in some embodiments, the isolation layer 93 extends in x direction to pass through the gate structures 931-934.

Figures 10A, 10B:
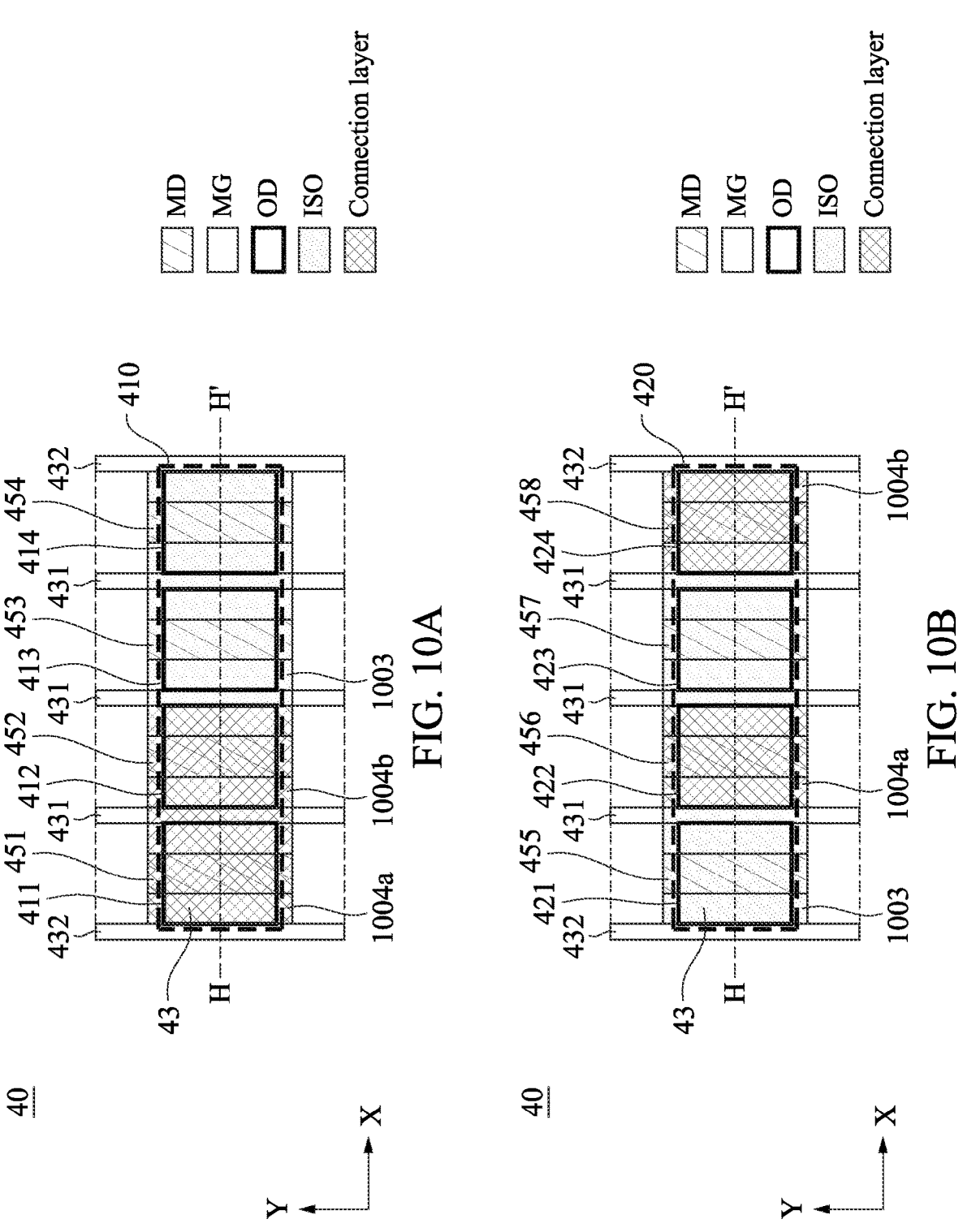
FIG. 10A is schematic layout diagram of part of a top layer in an integrated circuit, in accordance with some embodiments.
FIG. 10B is schematic layout diagram of part of a bottom layer in an integrated circuit, in accordance with some embodiments.
Figure 10C:
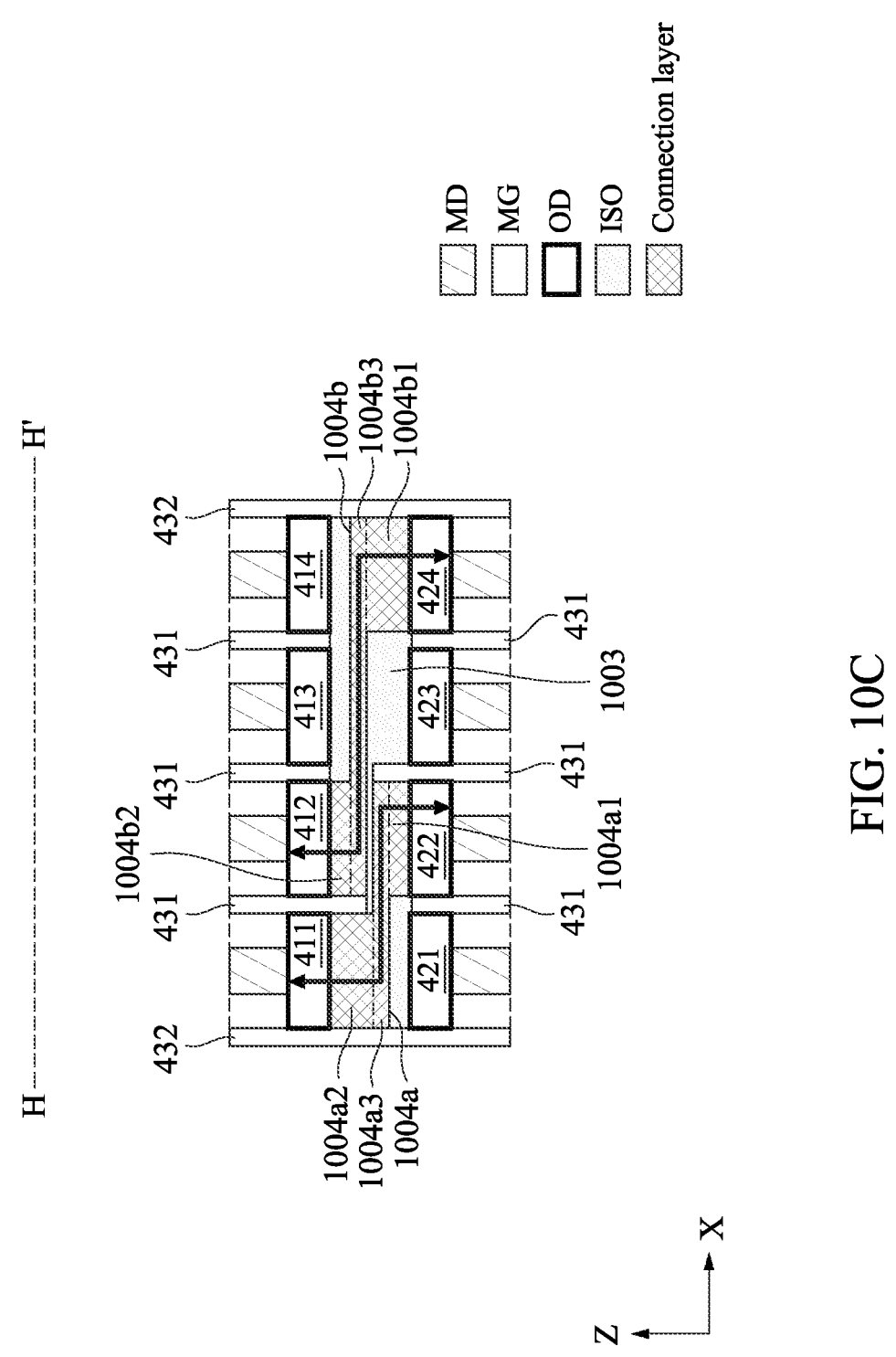
FIG. 10C is a schematic diagram of an integrated circuit corresponding to FIGS. 10A-10B in a cross-section view, in accordance with some embodiments.

Reference is now made to FIGS. 10A-10C. FIG. 10A is schematic layout diagram of part of a top layer in an integrated circuit 1000, FIG. 10B is schematic layout diagram of part of a bottom layer in the integrated circuit 1000, and FIG. 10C is a schematic diagram of the integrated circuit 1000 corresponding to FIGS. 4A-4B in a cross-section view along a line HH', in accordance with some embodiments. With respect to the embodiments of FIGS. 1A-9D, like elements in FIGS. 10A-10C are designated with the same reference numbers for ease of understanding.

Compared with embodiments of FIGS. 4A-4C, instead of using one connection layer 44 to connect one of the active regions in the top layer to one of the active regions in the bottom layer, the integrated circuit 1000 includes two connection layers 1004a-1000b that are arranged between the top and bottom layers of the integrated circuit 1000 to electrically connect elements in the top layer to elements in the bottom layer. An isolation layer 1003 isolates the connection layers 1004a-1004b from each other and from the gate structures 431-432. In some embodiments, the isolation layer 1003 is configured with respect to, for example, the isolation layer 43.

For illustration, with reference to layouts in FIGS. 10A-10B together, the connection layer 1004a overlaps the active region 411 and the conductive segment 451 in the top layer and also overlaps the active region 422 and the conductive segment 456 in the bottom layer. In addition, the connection layer 1004b overlaps the active region 412 and the conductive segment 452 in the top layer and also overlaps the active region 424 and the conductive segment 458 in the bottom layer.

With reference to FIG. 10C, the connection layer 1004a includes portions 1004a1-1004a3 that are configured with respect to, for example, the portions 441-443 of FIG. 4A. For example, the portion 1004a1 contacts the active region 422, the portion 1004a2 contacts the active region 411, and the portion 1004a3 couples between the portions 1004a1-1004a2. Accordingly, the active regions 422 and 411 are electrically coupled with each other. In some embodiments, the portion 1004a3 further extends in x direction between the active regions 411-412 and 421-422 and extends across at least two poly pitches CPP.

The connection layer 1004b includes portions 1004b1-1004b3 that are configured with respect to, for example, the portions 441-443 of FIG. 4A. For example, the portion 1004b1 contacts the active region 424, the portion 1004b2 contacts the active region 412, and the portion 1004b3 couples between the portions 1004b1-1004b2. Accordingly, the active regions 424 and 412 are electrically coupled with each other. In some embodiments, the portion 1004b3 further extends in x direction between the active regions 412-414 and 422-424 and extends across at least three poly pitches CPP. In the embodiments of FIG. 10C, the portions 1004b2-1004b3 are arranged above the portions 1004a1 and 1004a3.

For illustration, the isolation layer 1003 surrounds the connection layers 1004a-1004b. In a cross-section view, the isolation layer 1003 passed through the gate structures 431.

The configurations of FIGS. 10A-10C are given for illustrative purposes. Various implements are within the contemplated scope of the present disclosure. For example, in some embodiments, the connection layer 1004a connects one of the active regions 411-414 and one of the active regions 421-424 while the connection layer 1004b connects another of the active regions 411-414 and another of the active regions 421-424, the portion 1004a3 being arranged above the portion 1004b3.

According to some embodiments of manufacturing the integrated circuit 10,30, 40, 50, 60, 70, 80, 90 and/or 1000 depicted FIGS. 1A-10C, the stacked transistors including interposed connection layer(s) are formed in a monolithic process. In some embodiments, the manufacturing of the epitaxy layers in the top layer LY1, for example, in the monolithic process after manufacturing the connection layers between top and bottom structures is critical for the formation of the integrated circuit 10,30, 40, 50, 60, 70, 80, 90 and/or 1000. In another embodiment, the integrated circuit 10,30, 40, 50, 60, 70, 80, 90 and/or 1000 is formed in a wafer bonding process depicted in the FIGS. 11A-11F and will be discussed in the following paragraphs.

Reference is now made to FIGS. 11A-11F. FIGS. 11A-11F illustrate a manufacturing process of parts of an integrated circuit 1100, in accordance with some embodiments. In some embodiments, the integrated circuit 1100 is configured with respect to, for example, the integrated circuit 10, 30, 40, 50, 60, 70, 80, 90 and/or 1000 of FIGS. 1A-10C.

Figures 11A, 11B:
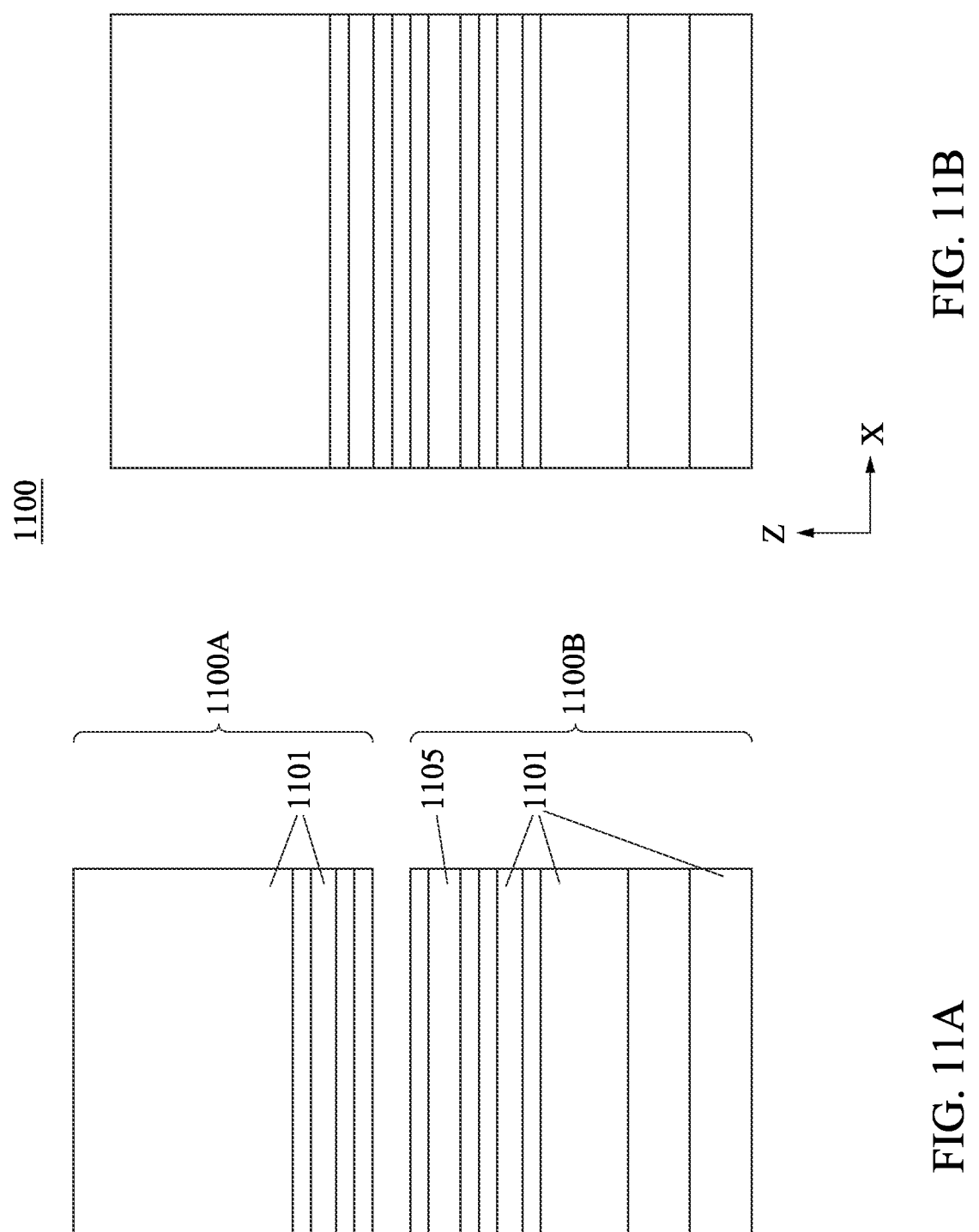
FIGS. 11A-11F illustrate a manufacturing process of parts of an integrated circuit, in accordance with some embodiments.

In FIG. 11A, a portion 1100A includes semiconductor layers 1101-1102 interlaced with each other along z direction and an adhesion layer 1103. In some embodiments, the portion 1100A corresponds to transistors of a first conductivity type, for example, the N-type transistor 11 of FIG. 1A. In some embodiments, the semiconductor layers 1101-1102 are made of materials having lattice constants different from each other. For example, in some embodiments, the semiconductor layers 1101 are made of silicon and the semiconductor layers 1102 are made of germanium (Ge). In some embodiments, the semiconductor layers 1102 correspond to the channel regions 113 and 123 in FIG. 1C. The above materials of the semiconductor layers 1101-1102 are given for illustrative purposes. Various materials of the semiconductor layers 1101-1102 are within the contemplated scope of the present disclosure.

A portion 1100B includes the semiconductor layers 1101-1102 interlaced with each other along z direction, dielectric layers 1104, and a connection layer 1105. In some embodiments, the portion 1100B corresponds to transistors of a second conductivity type, for example, the P-type transistor 11 of FIG. 1A. The dielectric layers 1104 correspond to the isolation layer 13 of FIG. 1A, and the connection layer 1105 corresponds to the connection layer 14 of FIG. 1A. For illustration, the connection layer 1105 is interposed between the dielectric layers 1104 and also between the semiconductor layers 1102 of the portions 1100A-1100B. In some embodiments, the connection layer 1105 includes highly doped silicon material.

With reference to both FIGS. 11A-11B, the portions 1100A and 1100B are bonded in a wafer bonding process to form a multilayer stack.

Figure 11D:
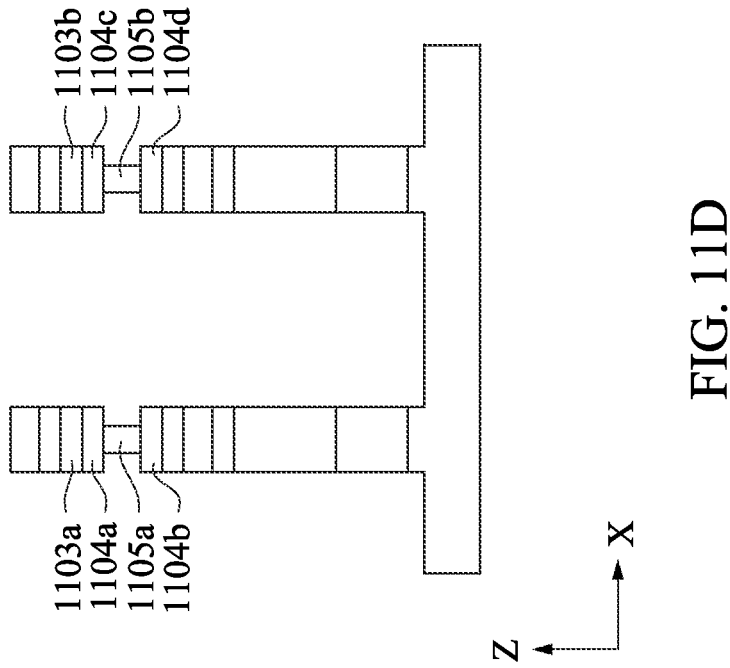
Figure 11C:
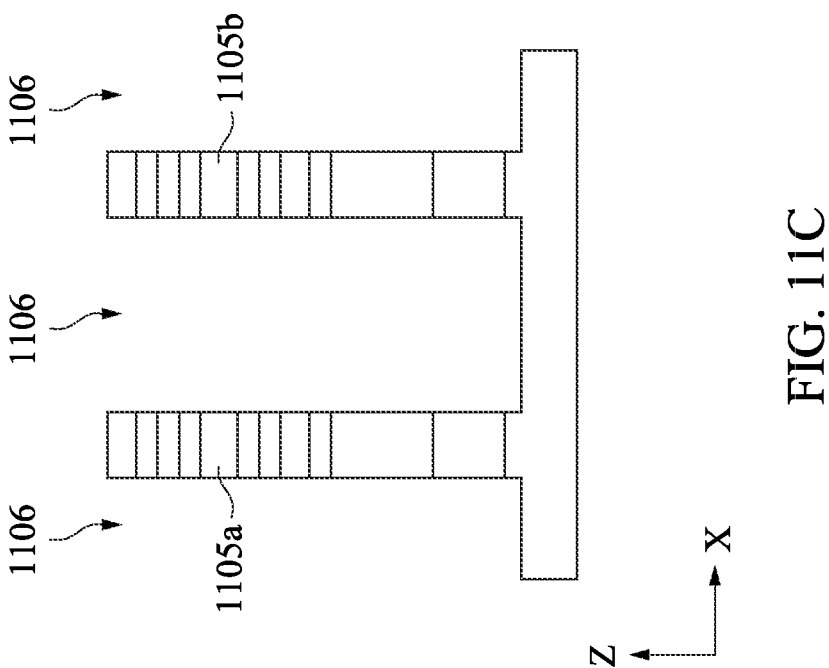

In FIG. 11C, a top one of the semiconductor layers 1101 in the multilayer stack is shrunk in a chemical mechanical polish (CMP) process, by etching, or other suitable process. In addition, fins are formed by generating openings 1106 between fins after the multilayer stack is patterned by using patterned mask layers and then etched. In some embodiments, drain/source structures are formed in the openings 1106 in other process.

As shown in FIG. 11D, parts of portions 1105a-1105b of the connection layer 1105 are removed to form recesses of the connection layer 1105.

Figures 11E, 11F:
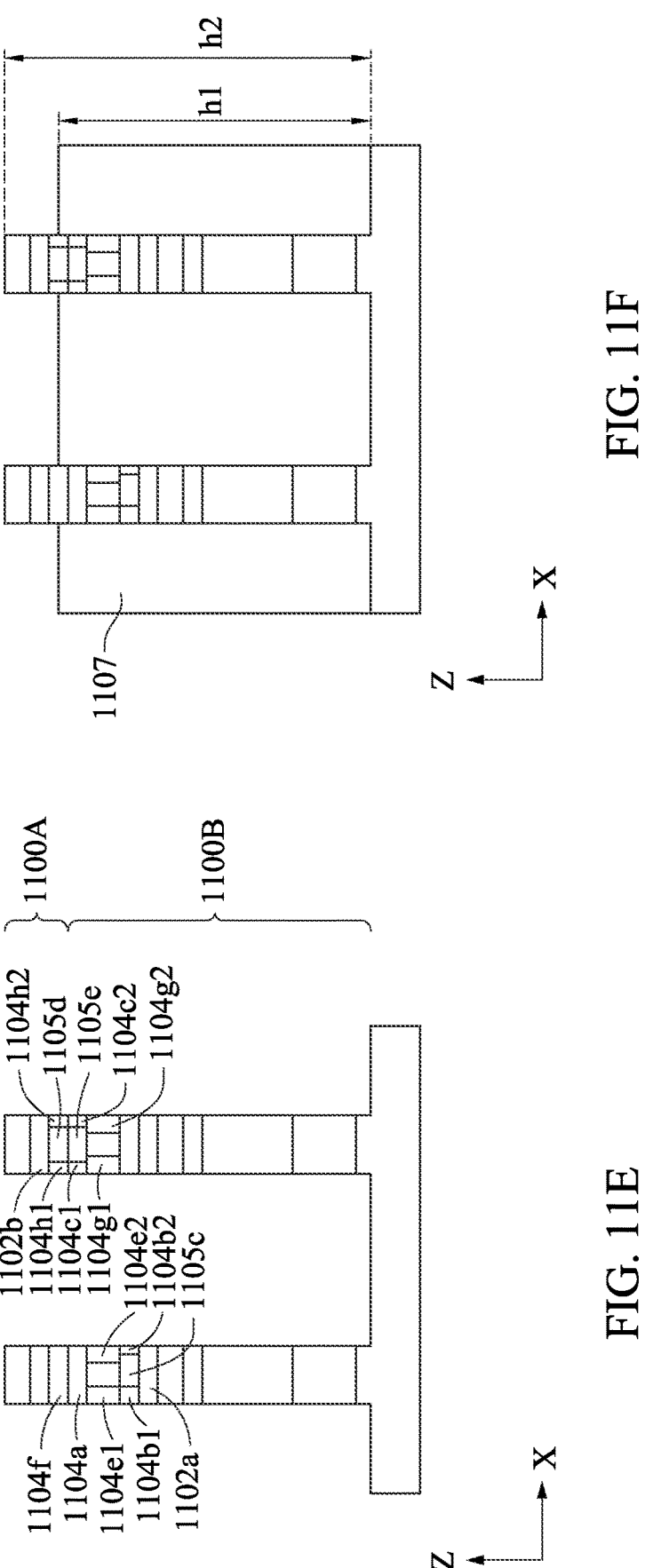

Furthermore, with reference to FIGS. 11D-11E, portions 1103a and 1103b of the adhesion layer 1103 are etched and replaced by a portion 1104f of the dielectric layer 1104 and portions 1104h1-1104h2 of the dielectric layer 1104 and a portion 1105d in the deposition process.

Specifically, a portion 1104b of the dielectric layer 1104 is etched to become a portion 1104b1, a portion 1105c of the connection layer 1105 is further formed in a liner deposition process, and later a portion 1104b2 of the dielectric layer 1104 is formed adjacent to the portion 1105c. Furthermore, portions 1104e1-1104e2 are formed in the recesses to surround the portion 1105a in the deposition process. The portion 1105a is electrically coupled to the portion 1105c and further to the semiconductor layer 1102a therebelow. Accordingly, the connection layer formed by the portions 1105a and 1105c is coupled to the bottom portion (for example, 1100B) of the multilayer stack, corresponding to the embodiments of FIG. 1B.

For another fin structure, a portion 1104c of the dielectric layer 1104 is etched to become a portion 1104c1, a portion 1105e of the connection layer 1105 is further formed in the liner deposition process, and later a portion 1104c2 of the dielectric layer 1104 is formed adjacent to the portion 1105b. Furthermore, portions 1104g1-1104g2 are formed in the recesses to surround the portion 1105b in the deposition process. The portion 1105b is electrically coupled to the portions 1105d-1105e and further to the semiconductor layer 1102b above. Accordingly, the connection layer formed by the portions 1105b, 1105d and 1105c is coupled to the top portion (for example, 1100A) of the multilayer stack, corresponding to the embodiments of FIG. 1C.

Moreover, as shown in FIG. 11F, a shallow trench isolation layer 1107 is formed to have a height h1 to cover the portion 1100B and parts of the portion 1100A to further semiconductor processes (not shown) of manufacturing an integrated circuit, for example, circuit 10, 30, 40, 50, 60, 70, 80, 90 and/or 1000 of FIGS. 1A-10C. In some embodiments, the height h1 is smaller than a height h2 of the multilayer stack.

Reference is now made to FIG. 12. FIG. 12 is a flow chart of a method 1200 of manufacturing an integrated circuit, in accordance with some embodiments. It is understood that additional operations/stages can be provided before, during, and after the processes shown by FIG. 12, and some of the operations/stages described below can be replaced or eliminated, for additional embodiments of the method 1200. The method 1200 includes operations 1201-1207 and will be discussed in the following paragraphs with reference to FIGS. 1A-11F.

In operation 1201, as show in FIGS. 1A-1D, the active area 120 of, for example, N conductivity type is formed to extend in x direction.

In operation 1202, the portion 13b of the isolation layer 13 is formed, contacting the active area 120.

In operation 1203, an opening 13ba in the portion 13b of the isolation layer 13 is formed, as shown in FIG. 1A.

In operation 1204, the portion 141 of the connection layer 14 on the portion 13b of the isolation layer 13 is formed. The portion 141 of the connection layer 14 contacts the active area 120 through the opening 13ba.

In operation 1205, the portion 13a of the isolation layer 13 is formed to surround the connection layer 14.

In operation 1206, an opening 13aa in the portion 13a of the isolation layer 13 is formed.

In operation 1207, the portion 142 of the connection layer 14 is formed to contact the active area 112 of N conductivity type through the opening 13aa in the portion 13a of the isolation layer 13.

In some embodiments, as shown in FIG. 7D, the method 1200 further includes steps of, for example, forming an opening 73bb in the portion 73b of the isolation layer 73 after forming the portion 73b of the isolation layer 73 and forming the portion 744, contacting the portions 743 and 741 of the connection layer 74, of the connection layer 74 to contact the active area 720 through the opening 73bb in the portion 73b of the isolation layer 73. In addition, the portion 741 contacts the active area 720 through the opening 73ba in the portion 73b of the isolation layer 73.

In some embodiments, the method 1200 further includes steps of, for example, forming the conductive segment 756 under the active area 720 and forming the conductive segment 753 on the active area 710. The conductive segments 753 and 756 correspond to the drains of the transistors N71 and P71 respectively.

Figure 13:
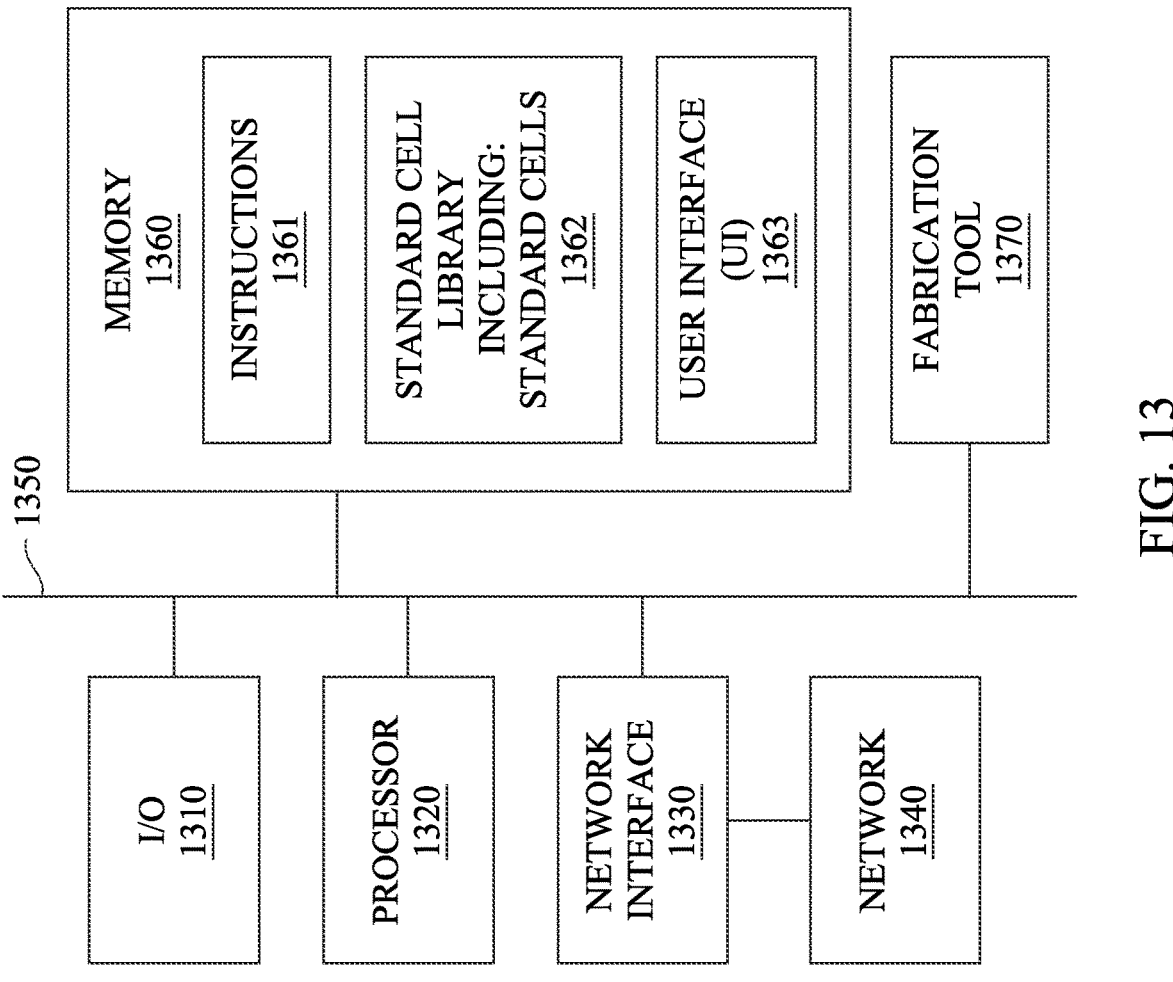
FIG. 13 is a block diagram of a system for designing the integrated circuit layout design, in accordance with some embodiments of the present disclosure.

Reference is now made to FIG. 13. FIG. 13 is a block diagram of an electronic design automation (EDA) system 1300 for designing the integrated circuit layout design, in accordance with some embodiments of the present disclosure. EDA system 1300 is configured to implement one or more operations of the method 1200 disclosed in FIG. 12, and further explained in conjunction with FIGS. 1A-12. In some embodiments, EDA system 1300 includes an APR system.

In some embodiments, EDA system 1300 is a general purpose computing device including a hardware processor 1320 and a non-transitory, computer-readable storage medium 1360. Storage medium 1360, amongst other things, is encoded with, i.e., stores, computer program code (instructions) 1361, i.e., a set of executable instructions. Execution of instructions 1361 by hardware processor 1320 represents (at least in part) an EDA tool which implements a portion or all of, e.g., the method 1200.

The processor 1320 is electrically coupled to computer-readable storage medium 1360 via a bus 1350. The processor 1320 is also electrically coupled to an I/O interface 1310 and a fabrication tool 1390 by bus 1350. A network interface 1330 is also electrically connected to processor 1320 via bus 1350. Network interface 1330 is connected to a network 1340, so that processor 1320 and computer-readable storage medium 1360 are capable of connecting to external elements via network 1340. The processor 1320 is configured to execute computer program code 1361 encoded in computer-readable storage medium 1360 in order to cause EDA system 1300 to be usable for performing a portion or all of the noted processes and/or methods. In one or more embodiments, processor 1320 is a central processing unit (CPU), a multi-processor, a distributed processing system, an application specific integrated circuit (ASIC), and/or a suitable processing unit.

In one or more embodiments, computer-readable storage medium 1360 is an electronic, magnetic, optical, electromagnetic, infrared, and/or a semiconductor system (or apparatus or device). For example, computer-readable storage medium 1360 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1360 includes a compact disk-read only memory (CD-ROM), a compact disk-read/write (CD-R/W), and/or a digital video disc (DVD).

In one or more embodiments, storage medium 1360 stores computer program code 1361 configured to cause EDA system 1300 (where such execution represents (at least in part) the EDA tool) to be usable for performing a portion or all of the noted processes and/or methods. In one or more embodiments, storage medium 1360 also stores information which facilitates performing a portion or all of the noted processes and/or methods. In one or more embodiments, storage medium 1360 stores library 1362 of standard cells including such standard cells as disclosed herein, for example, a cell shown in FIGS. 1A-10C.

EDA system 1300 includes I/O interface 1310. I/O interface 1310 is coupled to external circuitry. In one or more embodiments, I/O interface 1310 includes a keyboard, keypad, mouse, trackball, trackpad, touchscreen, and/or cursor direction keys for communicating information and commands to processor 1320.

EDA system 1300 also includes network interface 1330 coupled to processor 1320. Network interface 1330 allows EDA system 1300 to communicate with network 1340, to which one or more other computer systems are connected. Network interface 1330 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1300.

EDA system 1300 also includes the fabrication tool 1390 coupled to processor 1320. The fabrication tool 1390 is configured to fabricate integrated circuits, e.g., the integrated circuits 10, 30-90, and 1000 illustrated in FIGS. 1A-10C, according to the design files processed by the processor 1320.

EDA system 1300 is configured to receive information through I/O interface 1310. The information received through I/O interface 1310 includes one or more of instructions, data, design rules, libraries of standard cells, and/or other parameters for processing by processor 1320. The information is transferred to processor 1320 via bus 1350. EDA system 1300 is configured to receive information related to a UI through I/O interface 1310. The information is stored in computer-readable medium 1360 as user interface (UI) 1363.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1300. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 14:
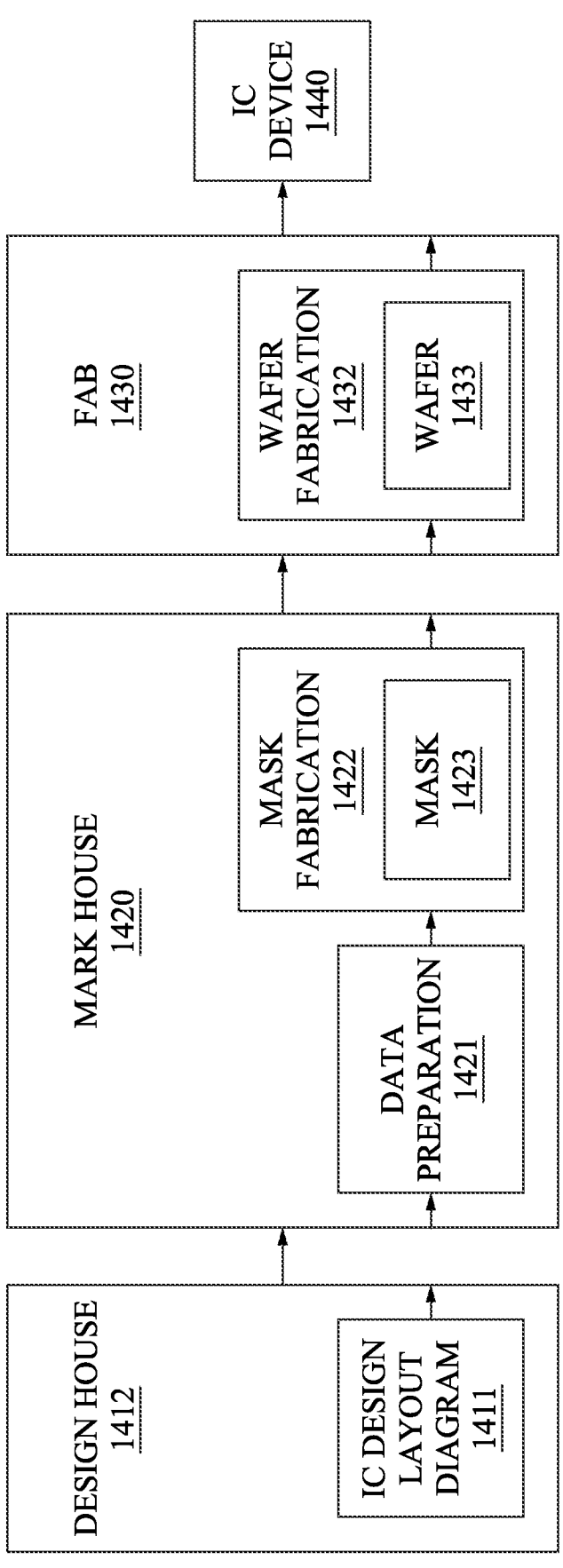
FIG. 14 is a block diagram of an integrated circuit manufacturing system, and an integrated circuit manufacturing flow associated therewith, in accordance with some embodiments.

FIG. 14 is a block diagram of IC manufacturing system 1400, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1400.

In FIG. 14, IC manufacturing system 1400 includes entities, such as a design house 1410, a mask house 1420, and an IC manufacturer/fabricator ("fab") 1430, that interact with one another in the design, development, and manufacturing cycles and/or services related to manufacturing an IC device 1440. The entities in IC manufacturing system 1400 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1410, mask house 1420, and IC fab 1430 is owned by a single larger company. In some embodiments, two or more of design house 1410, mask house 1420, and IC fab 1430 coexist in a common facility and use common resources.

Design house (or design team) 1410 generates an IC design layout diagram 1411. IC design layout diagram 1411 includes various geometrical patterns, for example, an IC layout design depicted in FIGS. 1A-10C, designed for an IC device 1440, for example, integrated circuits 10, 30-90, and 1100, discussed above with respect to FIGS. 1A-10C. The geometrical patterns correspond to patterns of metal, oxide, or semiconductor layers that make up the various components of IC device 1440 to be fabricated. The various layers combine to form various IC features. For example, a portion of IC design layout diagram 1411 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1410 implements a proper design procedure to form IC design layout diagram 1411. The design procedure includes one or more of logic design, physical design or place and route. IC design layout diagram 1411 is presented in one or more data files having information of the geometrical patterns. For example, IC design layout diagram 1411 can be expressed in a GDSII file format or DFII file format.

Mask house 1420 includes data preparation 1421 and mask fabrication 1422. Mask house 1420 uses IC design layout diagram 1411 to manufacture one or more masks 1423 to be used for fabricating the various layers of IC device 1440 according to IC design layout diagram 1411. Mask house 1420 performs mask data preparation 1421, where IC design layout diagram 1411 is translated into a representative data file ("RDF"). Mask data preparation 1421 provides the RDF to mask fabrication 1422. Mask fabrication 1422 includes a mask writer. A mask writer converts the RDF to an image on a substrate, such as a mask (reticle) 1423 or a semiconductor wafer 1431. The IC design layout diagram 1411 is manipulated by mask data preparation 1421 to comply with particular characteristics of the mask writer and/or requirements of IC fab 1430. In FIG. 14, data preparation 1421 and mask fabrication 1422 are illustrated as separate elements. In some embodiments, data preparation 1421 and mask fabrication 1422 can be collectively referred to as mask data preparation.

In some embodiments, data preparation 1421 includes optical proximity correction (OPC) which uses lithography enhancement techniques to compensate for image errors, such as those that can arise from diffraction, interference, other process effects and the like. OPC adjusts IC design layout diagram 1411. In some embodiments, data preparation 1421 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1421 includes a mask rule checker (MRC) that checks the IC design layout diagram 1411 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1411 to compensate for limitations during mask fabrication 1422, which may undo part of the modifications performed by OPC in order to meet mask creation rules.

In some embodiments, data preparation 1421 includes lithography process checking (LPC) that simulates processing that will be implemented by IC fab 1430 to fabricate IC device 1440. LPC simulates this processing based on IC design layout diagram 1411 to create a simulated manufactured device, such as IC device 1440. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1411.

It should be understood that the above description of data preparation 1421 has been simplified for the purposes of clarity. In some embodiments, data preparation 1421 includes additional features such as a logic operation (LOP) to modify the IC design layout diagram 1411 according to manufacturing rules. Additionally, the processes applied to IC design layout diagram 1411 during data preparation 1421 may be executed in a variety of different orders.

After data preparation 1421 and during mask fabrication 1422, a mask 1423 or a group of masks 1423 are fabricated based on the modified IC design layout diagram 1411. In some embodiments, mask fabrication 1422 includes performing one or more lithographic exposures based on IC design layout diagram 1411. In some embodiments, an electron-beam (e-beam) or a mechanism of multiple e-beams is used to form a pattern on a mask (photomask or reticle) 1423 based on the modified IC design layout diagram 1411. Mask 1423 can be formed in various technologies. In some embodiments, mask 1423 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1423 includes a transparent substrate (for example, fused quartz) and an opaque material (for example, chromium) coated in the opaque regions of the binary mask. In another example, mask 1423 is formed using a phase shift technology. In a phase shift mask (PSM) version of mask 1423, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1422 is used in a variety of processes. For example, such a mask(s) is used in an ion implantation process to form various doped regions in semiconductor wafer 1432, in an etching process to form various etching regions in semiconductor wafer 1432, and/or in other suitable processes.

IC fab 1430 includes wafer fabrication 1431. IC fab 1430 is an IC fabrication business that includes one or more manufacturing facilities for the fabrication of a variety of different IC products. In some embodiments, IC Fab 1430 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1430 uses mask(s) 1423 fabricated by mask house 1420 to fabricate IC device 1440. Thus, IC fab 1430 at least indirectly uses IC design layout diagram 1411 to fabricate IC device 1440. In some embodiments, semiconductor wafer 1432 is fabricated by IC fab 1430 using mask(s) 1423 to form IC device 1440. In some embodiments, the IC fabrication includes performing one or more lithographic exposures based at least indirectly on IC design layout diagram 1411. Semiconductor wafer 1432 includes a silicon substrate or other proper substrate having material layers formed thereon. Semiconductor wafer 1432 further includes one or more of various doped regions, dielectric features, multi-level interconnects, and the like (formed at subsequent manufacturing steps).

As described above, the present application provides the connection layer and the isolation layer that are arranged between two stacked transistors, which does not impact the width of the active areas, the gate density and the performance of the integrated circuit, compared with some approaches that utilizing contacts arranged beside the active areas. Furthermore, with the configurations of the present application, through the connection layer disposed between P and N type epitaxial layers, feasibility of routing between transistors is provided.

In some embodiments, an integrated circuit is provided and includes a first transistor of a first conductivity type comprising first and second active regions, a second transistor of a second conductivity type comprising third and fourth active regions and arranged under the first transistor along a first direction, a first gate structure extending in the first direction and shared by the first and second transistors, an isolation layer sandwiched between the first and second transistors and extending along a second direction to pass through the first gate structure, and a connection layer surrounded by the isolation layer and extending along the second direction to pass through the first gate structure. The isolation layer has a first surface contacting the first and second active regions and a second surface contacting the third and fourth active regions. The connection layer comprises first and second portions are electrically coupled to the first and fourth active regions.

In some embodiments, an integrated circuit is provided and includes a plurality of first active regions arranged in a first semiconductor layer and corresponding to at least one first transistor of a first conductivity type; a plurality of second active regions arranged in a second semiconductor layer over the first semiconductor layer and corresponding to at least one second transistor of a second conductivity type different from the first conductivity type; an isolation layer arranged in a third semiconductor layer sandwiched between the first and second semiconductor layers; and a connection layer arranged in the third semiconductor layer and surrounded by the isolation layer, wherein the connection layer contacts and electrically couples to first and second regions in the plurality of first and second active regions.

In some embodiments, a method is provided and includes steps as below: forming a first active area of a first conductivity type extending in a first direction; forming a first portion of an isolation layer contacting the first active area; forming a first opening in the first portion of the isolation layer; forming a first portion of a connection layer on the first portion of the isolation layer, wherein the first portion of the connection layer contacts the first active area through the first opening; forming a second portion of the isolation layer to surround the connection layer; forming an opening in the second portion of the isolation layer; and forming a second portion of the connection layer to contact a second active area of a second conductivity type different from the first conductivity type through the opening in the second portion of the isolation layer.

In some embodiments, a method is provided and includes steps as below: bonding a first portion of an integrated circuit to a second portion of the integrated circuit, wherein the second portion comprises a first connection layer portion interposed between a first isolation layer and a second isolation layer; etching the first isolation layer and forming a second connection layer portion adjacent to the first isolation layer to connect a first portion of the first connection layer portion, wherein the first portion of the first connection layer portion is further coupled to a first channel region in the second portion of the integrated circuit; etching the second isolation layer and forming a third connection layer portion adjacent to the second isolation layer to electrically couple a second portion of the first connection layer portion, wherein the first portion of the first connection layer portion is above the second connection layer, and the second portion of the first connection layer portion is below the third connection layer; and forming a fourth connection layer portion to electrically couple the third connection layer portion to a second channel region in the first portion of the integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a first transistor of a first conductivity type comprising first and second active regions;
   a second transistor of a second conductivity type comprising third and fourth active regions and arranged under the first transistor along a first direction;
   a first gate structure extending in the first direction and shared by the first and second transistors;
   an isolation layer sandwiched between the first and second transistors and extending along a second direction to pass through the first gate structure, wherein the isolation layer has a first surface contacting the first and second active regions and a second surface contacting the third and fourth active regions; and a connection layer surrounded by the isolation layer and extending along the second direction to pass through the first gate structure, wherein the connection layer comprises first and second portions are electrically coupled to the first and fourth active regions.

2. The integrated circuit of claim 1, wherein the first and second portions of the connection layer extend in the first direction to pass through the isolation layer to contact the first and fourth active regions respectively.

3. The integrated circuit of claim 1, wherein the isolation layer is configured to isolate the first active region from the third active region and to isolate the second active region from the third active region.

4. The integrated circuit of claim 1, wherein the connection layer is a metal layer.

5. The integrated circuit of claim 1, wherein the connection layer is a conductive silicon doped layer.

6. The integrated circuit of claim 1, wherein the isolation layer is configured to isolate the connection layer from the first gate structure.

7. The integrated circuit of claim 1, further comprising:

a first conductive segment disposed above and contacted the first active region; and a second conductive segment disposed under and contacted the third active region, wherein the third active region is configured to receive a supply voltage transmitted through the second conductive segment from a backside of the integrated circuit, and the connection layer is disposed between the first and second conductive segments.

8. The integrated circuit of claim 1, further comprising:

a first conductive segment disposed above and contacted the first active region; and a second conductive segment disposed under and contacted the third active region, wherein the connection layer is disposed between the first and second conductive segments.

9. The integrated circuit of claim 1, further comprising:

a third transistor comprising a fifth active region and sharing the second active region of the first transistor; and a fourth transistor comprising a sixth active region and sharing the third active region of the second transistor, wherein the isolation layer and the connection layer are sandwiched between third and fourth transistors, wherein the connection layer is further electrically coupled to the sixth active region.

10. The integrated circuit of claim 9, further comprising:

a second gate structure extending parallel to the first gate structure and shared by the third and fourth transistors, wherein the connection layer passes through the second gate structure and is electrically isolated from the second gate structure.

11. An integrated circuit, comprising:

a plurality of first active regions arranged in a first semiconductor layer and corresponding to at least one first transistor of a first conductivity type;

a plurality of second active regions arranged in a second semiconductor layer over the first semiconductor layer and corresponding to at least one second transistor of a second conductivity type different from the first conductivity type;

an isolation layer arranged in a third semiconductor layer sandwiched between the first and second semiconductor layers; and a first connection layer arranged in the third semiconductor layer and surrounded by the isolation layer, wherein the first connection layer contacts and electrically couples to first and second regions in the plurality of first and second active regions.

12. The integrated circuit of claim 11, wherein the first connection layer comprises first to third portions, the first and second portions extending in a first direction, and the third portion extending in a second direction, wherein the first and second portions contact third and fourth regions in the plurality of second active regions respectively, wherein the third and fourth regions are separated from each other in the first direction.

13. The integrated circuit of claim 12, wherein the third portion of the first connection layer extends across at least two poly pitches.

14. The integrated circuit of claim 11, wherein the first and second regions correspond to drains of the at least one first transistor and the at least one second transistor, the drains being coupled to an output terminal of the integrated circuit, wherein the integrated circuit further comprises:

a conductive segment disposed under a third region in the plurality of first active regions and corresponding to a source of the at least one first transistor to receive a supply voltage from a conductive line at a backside of the integrated circuit.

15. The integrated circuit of claim 11, wherein the at least one first transistor comprises a plurality of the first transistors, and the at least one second transistor comprises a plurality of the second transistors, wherein the first region corresponds to a drain of a first one in the plurality of the first transistors, and the second region corresponds to a drain of a first one in the plurality of the second transistors, wherein the integrated circuit further comprises:

a first conductive segment disposed under a third region in the plurality of first active regions and corresponding to a source of the first one in the plurality of the first transistors to receive a first supply voltage from a first conductive line at a backside of the integrated circuit; and a second conductive segment disposed on a fourth region in the plurality of second active regions and corresponding to a source of a second one in the plurality of the second transistors to receive a second supply voltage from a second conductive line at a front side, opposite to the backside, of the integrated circuit.

16. The integrated circuit of claim 15, wherein the first connection layer extends in a first direction to contact a fifth region of the plurality of first active regions, wherein the fourth and fifth regions are separated from each other in a second direction different from the first direction.

17. The integrated circuit of claim 11, further comprising:

a second connection layer arranged between the plurality of first active regions and the plurality of second active regions and surrounded by the isolation layer, wherein the second connection layer, wherein the second connection layer overlaps the first connection layer in a layout view.

18. The integrated circuit of claim 17, wherein the second connection layer is configured to electrically couple one of the plurality of first active regions with one of the plurality of second active regions.

19. A method, comprising:

bonding a first portion of an integrated circuit to a second portion of the integrated circuit, wherein the second portion comprises a first connection layer portion interposed between a first isolation layer and a second isolation layer;

etching the first isolation layer and forming a second connection layer portion adjacent to the first isolation layer to connect a first portion of the first connection layer portion, wherein the first portion of the first connection layer portion is further coupled to a first channel region in the second portion of the integrated circuit;

etching the second isolation layer and forming a third connection layer portion adjacent to the second isolation layer to electrically couple a second portion of the first connection layer portion, wherein the first portion of the first connection layer portion is above the second connection layer, and the second portion of the first connection layer portion is below the third connection layer; and forming a fourth connection layer portion to electrically couple the third connection layer portion to a second channel region in the first portion of the integrated circuit.

20. The method of claim 19, further comprising:

replacing an adhesion layer, between the second channel region and the second isolation layer, in the first portion of the integrated circuit by a third isolation layer, wherein the fourth connection layer is formed in the adhesion layer.

\*  \*  \*  \*  \*